(12) United States Patent
Onodera et al.

(10) Patent No.: US 11,387,810 B2
(45) Date of Patent: Jul. 12, 2022

(54) HIGH-FREQUENCY MODULE

(71) Applicant: Murata Manufacturing Co., Ltd., Kyoto (JP)

(72) Inventors: Syuichi Onodera, Kyoto (JP); Takashi Watanabe, Kyoto (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 98 days.

(21) Appl. No.: 16/720,284

(22) Filed: Dec. 19, 2019

(65) Prior Publication Data
US 2020/0204159 A1 Jun. 25, 2020

(30) Foreign Application Priority Data

Dec. 21, 2018 (JP) .............................. JP2018-239615

(51) Int. Cl.
*H03H 9/72* (2006.01)
*H01L 23/66* (2006.01)
(Continued)

(52) U.S. Cl.
CPC ............... *H03H 9/72* (2013.01); *H01L 23/66* (2013.01); *H01L 41/053* (2013.01);
(Continued)

(58) Field of Classification Search
CPC .......... H03H 9/25; H03H 9/72; H05K 1/0237; H05K 1/11; H01L 23/66; H01L 41/05; H01L 41/03
See application file for complete search history.

(56) References Cited

U.S. PATENT DOCUMENTS 7,268,426 B2 * 9/2007 Warner ............... H01L 23/4334
257/E23.092
7,453,153 B2 * 11/2008 Saita ....................... H01L 24/49
257/E23.079
(Continued)

FOREIGN PATENT DOCUMENTS

JP   H05-114828 A    5/1993
JP   2006-186747 A   7/2006
(Continued)

OTHER PUBLICATIONS

Notice of Reasons for Rejection for JP Patent Application No. 2018-239615 dated Jan. 26, 2021.

*Primary Examiner* — Samuel S Outten
*Assistant Examiner* — Alan Wong
(74) *Attorney, Agent, or Firm* — Pearne & Gordon LLP

(57) ABSTRACT

A high-frequency module includes a substrate having a mounting surface, a laminated component disposed on the mounting surface, and a wiring, in which the laminated component includes a lower stage component, and an upper stage component disposed on the lower stage component, the lower stage component includes a lower surface 31 facing the mounting surface, an upper surface facing the lower surface 31 back to back, and a connection terminal 33 provided on the lower surface 31, the upper stage component includes a lower surface 41 facing the upper surface, and a connection terminal 43 provided on the lower surface 41, and the wiring is provided on the upper surface, and is connected with the connection terminal 43.

18 Claims, 8 Drawing Sheets

(51) Int. Cl.
*H05K 1/11* (2006.01)
*H01L 41/053* (2006.01)
*H03H 9/25* (2006.01)
*H05K 1/02* (2006.01)
*H03H 9/05* (2006.01)

(52) U.S. Cl.
CPC ............ *H03H 9/0547* (2013.01); *H03H 9/25* (2013.01); *H05K 1/0237* (2013.01); *H05K 1/11* (2013.01)

(56) References Cited

U.S. PATENT DOCUMENTS

| | | | |
|---|---|---|---|
| 8,436,697 B2* | 5/2013 | Takamine | H03H 9/725 |
| | | | 333/133 |
| 8,963,652 B2* | 2/2015 | Kitajima | H03H 9/725 |
| | | | 333/132 |
| 9,048,112 B2* | 6/2015 | Pan | H01L 23/49822 |
| 9,425,149 B1* | 8/2016 | Jiang | H01L 23/5286 |
| 9,634,641 B2* | 4/2017 | Nishimura | H03H 9/706 |
| 9,673,186 B2* | 6/2017 | Takatani | H01L 25/18 |
| 10,269,769 B2* | 4/2019 | Frenette | H01L 25/0657 |
| 2015/0380634 A1 | 12/2015 | Henn et al. | |
| 2017/0346463 A1 | 11/2017 | Hatakeyama et al. | |
| 2020/0007174 A1 | 1/2020 | Watanabe | |

FOREIGN PATENT DOCUMENTS

| | | |
|---|---|---|
| JP | 2006-203652 A | 8/2006 |
| JP | 2006-333127 A | 12/2006 |
| JP | 2009-218788 A | 9/2009 |
| JP | 2011-211347 A | 10/2011 |
| JP | 2015-091065 A | 5/2015 |
| JP | 2016-515331 A | 5/2016 |
| JP | 2017-212628 A | 11/2017 |
| WO | 2018/168653 A1 | 9/2018 |

* cited by examiner

HIGH-FREQUENCY MODULE

This application claims priority from Japanese Patent Application No. 2018-239615 filed on Dec. 21, 2018. The content of this application is incorporated herein by reference in its entirety.

BACKGROUND OF THE DISCLOSURE

1. Field of the Disclosure

The present disclosure relates to a high-frequency module.

2. Description of the Related Art

Devices in which functional structures such as acoustic wave resonators are laminated have been known. For example, Japanese Unexamined Patent Application Publication (Translation of PCT Application) No. 2016-515331 discloses a device including a first functional structure disposed in a cavity covered by a thin film cover and a second functional structure disposed on the thin film cover. Electrical connection to the second functional structure is performed by a plated-through hole through the thin film cover.

However, in the device described above, the larger the number of terminals of the electric connection to the second functional structure is, the larger a space for providing the plated-through hole is. Therefore, it is difficult to downsize the device.

BRIEF SUMMARY OF THE DISCLOSURE

Accordingly, it is an object of the present disclosure to provide a small-sized high-frequency module.

In order to solve the above problem, a high-frequency module according to a preferred embodiment of the present disclosure includes a substrate having a first mounting surface, a first laminated component disposed on the first mounting surface, and a first wiring, in which the first laminated component includes a first component, and a second component disposed on the first component, the first component includes a first surface facing the first mounting surface, a second surface facing the first surface back to back and a first connection terminal disposed on the first surface, the second component includes a third surface facing the second surface, and a second connection terminal provided on the third surface, and the first wiring is provided on the second surface and is connected with the second connection terminal.

Other features, elements, characteristics and advantages of the present disclosure will become more apparent from the following detailed description of preferred embodiments of the present disclosure with reference to the attached drawings.

DETAILED DESCRIPTION OF THE DISCLOSURE

Hereinafter, the embodiments will be described in detail with reference to the figures.

The embodiments to be described below are all inclusive or specific examples. The numerical values, the shapes, the materials, the constituent elements, the arrangement positions and the connection forms of the constituent elements, the steps and the order of the steps described in the following embodiments are merely examples, and are not intended to limit the present disclosure. Further, among the constituent elements in the following embodiments, the constituent elements not described in the independent claims will be described as arbitrary constituent elements.

Further, each of the figures is a schematic diagram, and is not necessarily illustrated in detail. Therefore, for example, scales and the like are not necessarily consistent with each other in the figures. In addition, in the figures, the same reference signs are used to designate substantially the same constituent elements, and descriptions thereof will be omitted or simplified.

In this specification, the terms indicating the relationship between elements and indicating the shapes of the elements as well as the numerical ranges are not meant to represent only strict meanings, but are meant to include a substantially equal range, for example, a difference of approximately several %.

In the present specification, the terms "upper" and "lower" are not meant to refer to upward (vertically upward) and downward (vertically downward) directions in absolute spatial recognition, but are used as the terms defined by relative positional relationships based on a laminating order in a laminated configuration. The terms "upper" and "lower" also apply not only to a case where two constituent elements are spaced apart from each other and another element exists between the two constituent elements, but also to a case where two constituent elements are arranged in close contact with each other and the two components are in contact.

In the following embodiments, a side on which a laminated component is provided is referred to as "upper (or upper side)" and the opposite side is referred to as "lower (or lower side)", with reference to a substrate. In other words, among a plurality of components configuring a laminated component, a component close to the substrate is a lower stage component located on the lower side, and a component spaced apart from the substrate is an upper stage component located on the upper side.

First Embodiment 1-1. Configuration

Figure 1:
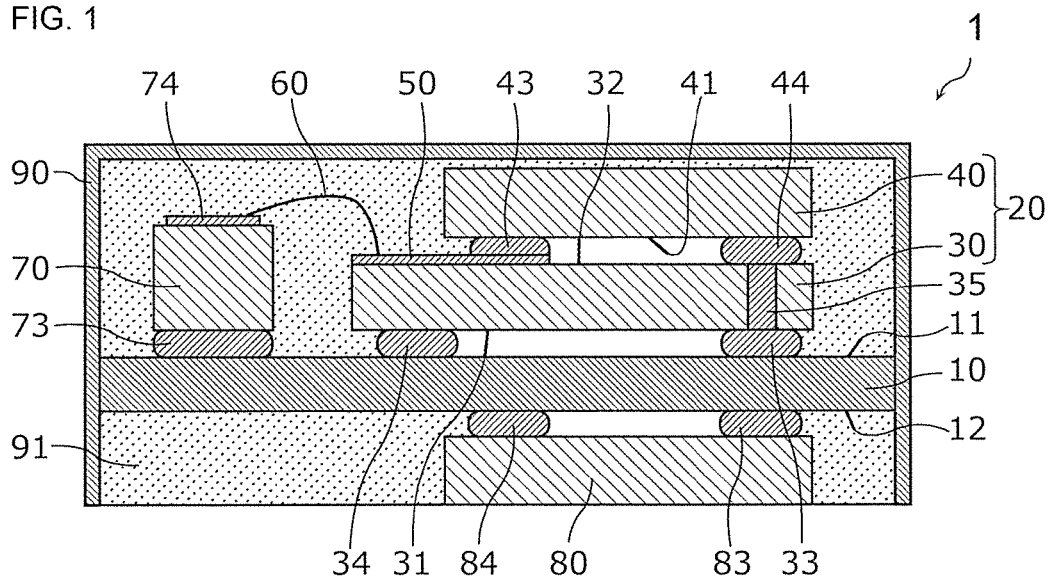
FIG. 1 is a cross-sectional view illustrating a configuration of a high-frequency module according to a first embodiment.

First, a configuration of a high-frequency module according to the first embodiment will be described with reference to FIG. 1. FIG. 1 is a cross-sectional view illustrating a configuration of a high-frequency module 1 according to the present embodiment.

As illustrated in FIG. 1, the high-frequency module 1 includes a substrate 10, a laminated component 20, a wiring 50, a wire 60, a component 70, a component 80, a cap member 90, and an encapsulating member 91. The laminated component 20 and the component 70 are provided on a mounting surface 11 of the substrate 10. The component 80 is provided on a mounting surface 12 of the substrate 10.

The substrate 10 is a mounting substrate on which circuit components are mounted. The substrate 10 has the mounting surface 11 and the mounting surface 12 facing each other back to back. The mounting surface 11 is an example of a first mounting surface included in the substrate 10. The mounting surface 12 is an example of a second mounting surface included in the substrate 10. The mounting surface 12 is a surface on the opposite side of the mounting surface 11.

The substrate 10 is, for example, a multilayer substrate in which a plurality of layers is laminated. The substrate 10 is, for example, a multilayer substrate made of resin, a ceramic multilayer substrate, a printed circuit board (PCB) substrate, or the like. Although not illustrated in the figure, a through-electrode for electrically connecting the mounting surface 11 and the mounting surface 12 is provided on the substrate 10.

The laminated component 20 is an example of a first laminated component, and has a laminated structure of a plurality of circuit components. Specifically, the laminated component 20 is disposed on the mounting surface 11, and includes a lower stage component 30 and an upper stage component 40.

The lower stage component 30 is an example of a first component, and is disposed on the mounting surface 11 of the substrate 10. The lower stage component 30 has a lower surface 31 and an upper surface 32, and connection terminals 33 and 34.

The lower surface 31 is an example of a first surface facing the mounting surface 11. The upper surface 32 is an example of a second surface facing the lower surface 31 back to back. Each of the connection terminals 33 and 34 is an example of a first connection terminal provided on the lower surface 31.

In the present embodiment, the lower stage component 30 is mounted on the substrate 10 with the connection terminals 33 and 34 interposed therebetween. Each of the connection terminals 33 and 34 is an input terminal or an output terminal for a signal to the lower stage component 30, a ground terminal for grounding the lower stage component 30, or the like. For example, in a plan view of the substrate 10, the connection terminals 33 and 34 overlap the lower stage component 30, and are positioned in an inner portion of a contour of the lower stage component 30. Each of the connection terminals 33 and 34 is formed using a conductive material, and is formed, for example, using a metal material such as copper, silver or gold. Each of the connection terminals 33 and 34 is, for example, a metal bump, such as a copper bump or a solder bump.

In the present embodiment, the lower stage component 30 includes an acoustic wave filter. Alternatively, the lower stage component 30 may be an integrated circuit (IC) or an integrated passive device (IPD). The IPD is, for example, a device in which passive elements such as inductors or capacitors are integrated. A functional surface which exhibits a function of the lower stage component 30 is the lower surface 31. That is, the lower surface 31 is provided with electrodes, wiring patterns, circuit elements, and the like included in the lower stage component 30.

Note that the acoustic wave filter is a filter circuit including an acoustic wave resonator. The acoustic wave resonator is, for example, a resonator using a surface acoustic wave (SAW), a resonator using a bulk acoustic wave (BAW), a film bulk acoustic resonator (FBAR), or the like. The SAW includes not only a surface acoustic wave but also a boundary acoustic wave.

The lower stage component 30 includes, for example, a SAW filter including a resonator using the SAW. Specifically, the lower stage component 30 includes a substrate having piezoelectricity and an interdigital transducer (IDT) electrode formed on the substrate. The IDT electrode is provided on the lower surface 31, and is not provided on the upper surface 32.

The substrate having the piezoelectricity is a substrate having piezoelectricity at least on its surface (hereinafter referred to as a piezoelectric substrate). Here, the surface is a surface on a lower surface 31 side. For example, the piezoelectric substrate may include a piezoelectric thin film formed on a surface thereof, and may be configured with a multilayer body formed with a film having a different acoustic velocity from that of the piezoelectric thin film, a support substrate, and the like. Further, the piezoelectric substrate may be a multilayer body including, for example, a high acoustic velocity support substrate and a piezoelectric thin film formed on the high acoustic velocity support substrate. The piezoelectric substrate may be a multilayer body including a high acoustic velocity support substrate, a low acoustic velocity film formed on the high acoustic velocity support substrate, and a piezoelectric thin film formed on the low acoustic velocity film. Alternatively, the piezoelectric substrate may be a multilayer body including a support substrate, a high acoustic velocity film formed on the support substrate, a low acoustic velocity film formed on the high acoustic velocity film, and a piezoelectric thin film formed on the low acoustic velocity film. Further, the piezoelectric substrate may have piezoelectricity over the entire substrate. The piezoelectric substrate is formed using LiNiBO$_3$, LiTaO$_3$, or the like. The same applies to acoustic wave resonators in other embodiments.

As illustrated in FIG. 1, the lower stage component 30 further includes a via conductor 35 extending through the lower stage component 30. The via conductor 35 extends through the lower stage component 30 from the upper surface 32 to the lower surface 31, and is exposed to both the upper surface 32 and the lower surface 31. The via conductor 35 electrically connects the connection terminal 33 and a connection terminal 44 of the upper stage component 40. The via conductor 35 is formed using a conductive material, and is formed using, for example, a metal material such as copper or silver. The via conductor 35 is provided in the lower stage component 30 for electrical connection of the upper stage component 40.

The upper stage component 40 is an example of a second component disposed on the lower stage component 30. The upper stage component 40 has a lower surface 41 and connection terminals 43 and 44.

The lower surface 41 is an example of a third surface facing the upper surface 32 of the lower stage component 30. The connection terminal 43 is an example of a second connection terminal provided on the lower surface 41. The connection terminal 44 is an example of a third connection terminal provided on the lower surface 41.

Each of the connection terminals 43 and 44 is an input terminal or an output terminal for a signal to the upper stage component 40, a ground terminal for grounding the upper stage component 40, or the like. For example, in a plan view of the substrate 10, the connection terminals 43 and 44 overlap the upper stage component 40, and are positioned in an inner portion of a contour of the upper stage component 40. Each of the connection terminals 43 and 44 is formed using a conductive material, and is formed, for example, using a metal material such as copper, silver or gold. Each of the connection terminals 43 and 44 is, for example, a metal bump, such as a copper bump or a solder bump.

In the present embodiment, the upper stage component 40 includes an acoustic wave filter. Alternatively, the upper stage component 40 may be an IC or an IPD. A functional surface that exhibits a function of the upper stage component 40 is the lower surface 41. That is, the lower surface 41 is provided with electrodes, wiring patterns, circuit elements, and the like included in the upper stage component 40.

For example, the upper stage component 40 includes a SAW filter. The upper stage component 40 includes a substrate having piezoelectricity and an IDT electrode formed on the substrate. The IDT electrode is provided on the lower surface 41.

In the present embodiment, the upper stage component 40 is mounted on the substrate 10 with the connection terminals 43 and 44 and the lower stage component 30 interposed therebetween. Specifically, the connection terminal 43 is connected to the wiring 50 provided on the upper surface 32 of the lower stage component 30. The connection terminal 44 is connected to the via conductor 35 that extends through the lower stage component 30.

The wiring 50 is an example of the first wiring, and is provided on the upper surface 32 of the lower stage component 30, and is connected with the connection terminal 43 of the upper stage component 40. The wiring 50 is connected to the component 70 by using the wire 60 by wire bonding.

The wiring 50 is a pattern wiring formed by using a material having conductivity. For example, a metal thin film formed on the upper surface 32 by using a metal material such as copper or silver is patterned into a predetermined shape, thereby forming the wiring 50. An example of a specific plan view shape of the wiring 50 will be described later.

The wire 60 is a bonding wire for electrically connecting the wiring 50 to the mounting surface 11 of the substrate 10 or the component 70. The wire 60 is, for example, a wire formed using a metal material such as gold, copper or aluminum. In the present embodiment, the wire 60 electrically connects the wiring 50 and a connection terminal 74.

Figure 2:
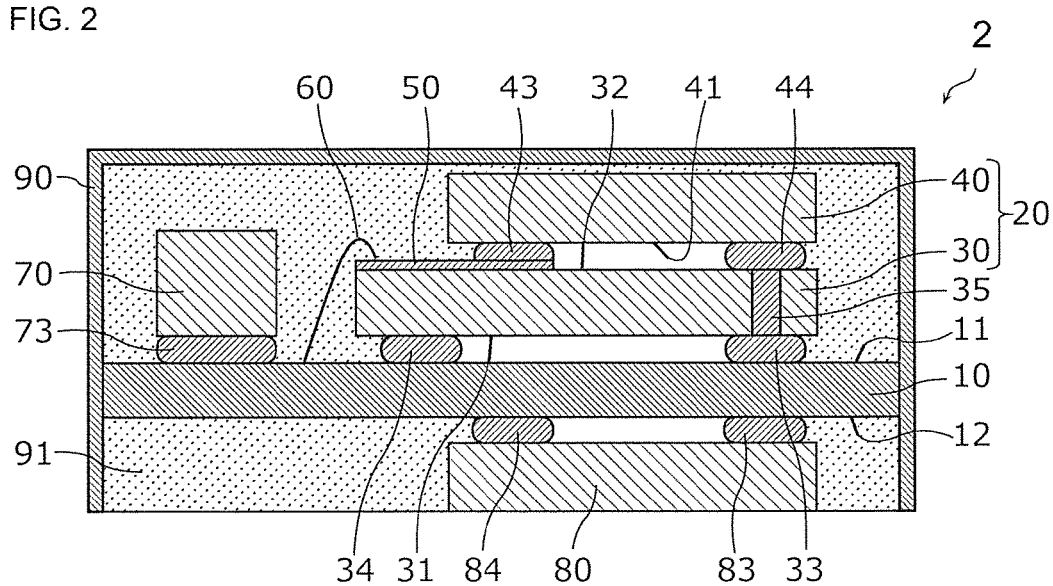
FIG. 2 is a cross-sectional view illustrating another configuration of the high-frequency module according to the first embodiment.

Note that, like a high-frequency module 2 illustrated in FIG. 2, the wire 60 may connect the wiring 50 and the mounting surface 11 of the substrate 10. FIG. 2 is a cross-sectional view illustrating another configuration example of the high-frequency module according to the present embodiment. For example, the wire 60 may be connected to a wiring pattern provided on the mounting surface 11 or a through-electrode extending through the substrate 10.

The component 70 is an example of other components that are different from the lower stage component 30 and the upper stage component 40 of the laminated component 20, and is provided on the same mounting surface 11 as the laminated component 20. The component 70 is, for example, a passive element such as an inductor or a capacitor, but is not limited thereto. The component 70 may be an IC or an IPD. Alternatively, the component 70 may be an element including another acoustic wave filter.

As illustrated in FIG. 1, the component 70 has connection terminals 73 and 74. The component 70 is mounted on the substrate 10 with the connection terminal 73 interposed therebetween. Further, the component 70 is electrically connected to the upper stage component 40 via the connection terminal 74, the wire 60 and the wiring 50. Each of the connection terminals 73 and 74 is formed using a conductive material, and is formed, for example, using a metal material such as copper, silver or gold. The connection terminal 73 is, for example, a metal bump such as a copper bump or a solder bump. The connection terminal 74 is, for example, a metal thin film patterned in a predetermined shape. Note that, as illustrated in FIG. 2, when the wire 60 is not connected to the component 70, the component 70 may not have the connection terminal 74.

The component 80 is an example of a third integrated circuit provided on the mounting surface 12. Note that the component 80 may include an acoustic wave filter. Alternatively, the component 80 may be an IPD.

The component 80 has connection terminals 83 and 84. The component 80 is mounted on the mounting surface 12 of the substrate 10 with the connection terminals 83 and 84 interposed therebetween. Each of the connection terminals 83 and 84 is formed using a conductive material, and is formed, for example, using a metal material such as copper, silver or gold. Each of the connection terminals 83 and 84 is, for example, a metal bump, such as a copper bump or a solder bump.

The cap member 90 is a member that covers the substrate 10 and circuit components mounted on the substrate 10. The cap member 90 is, for example, a substantially rectangular parallelepiped housing whose one surface is opened. The cap member 90 is formed of, for example, a conductive material, and also functions as a shield member for electrostatic shielding.

The encapsulating member 91 is filled in the cap member 90 to encapsulate the circuit components mounted on the substrate 10. The encapsulating member 91 is formed using, for example, an insulating resin material. In this embodiment, each of the lower stage component 30 and the upper stage component 40 includes a SAW filter, and an IDT electrode is provided on each of the lower surfaces 31 and 41. For this reason, the encapsulating member 91 is not provided between the lower surface 31 of the lower stage component 30 and the mounting surface 11 of the substrate 10 and between the lower surface 41 of the upper stage component 40 and the upper surface 32 of the lower stage component 30, but a cavity is provided there. Although the encapsulating member 91 is not provided between the component 80 and the mounting surface 12 of the substrate 10 in FIG. 1, the encapsulating member 91 may also be provided there. In addition, when vibration of the SAW filter can be secured, the encapsulating member 91 may be provided between the lower surface 31 and the mounting surface 11 and between the lower surface 41 and the upper surface 32.

Note that the high-frequency module 1 does not need to include at least one of the cap member 90 and the encapsulating member 91.

1-2. Circuit Configuration

Next, a specific circuit configuration of the high-frequency module 1 illustrated in FIG. 1 will be described.

Figure 3:
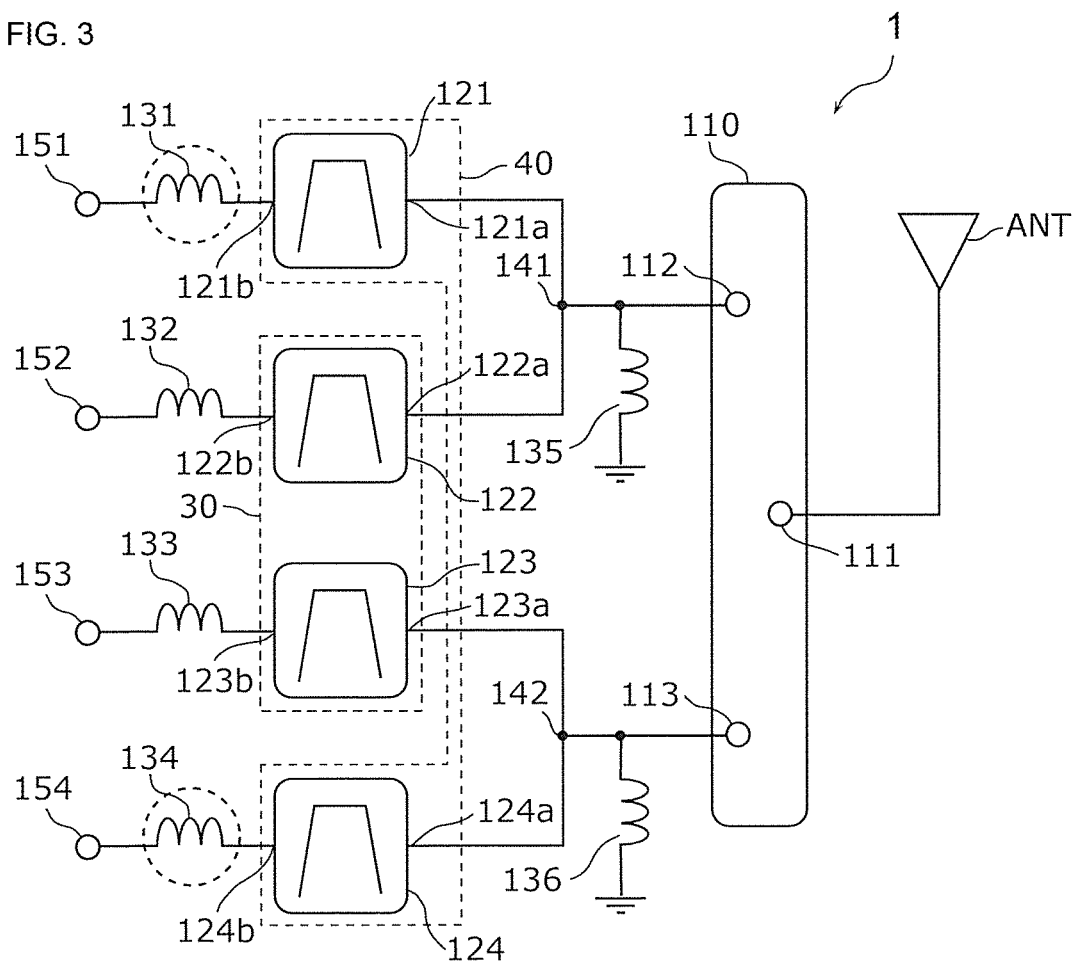
FIG. 3 is a circuit diagram illustrating a circuit configuration of the high-frequency module according to the first embodiment.

FIG. 3 is a circuit diagram illustrating the circuit configuration of the high-frequency module 1 according to the present embodiment. As illustrated in FIG. 3, the high-frequency module 1 includes a switch circuit 110, a plurality of filters 121 to 124, and a plurality of inductors 131 to 136.

In addition, in FIG. 3, an antenna element ANT is illustrated. The antenna element ANT is a multi-band compatible antenna which transmits and receives high-frequency signals and which is compliant with communication standards such as Long Term Evolution (LTE). The high-frequency module 1 and the antenna element ANT are disposed in, for example, a front-end unit of a multi-mode/multi-band compatible cellular phone.

The switch circuit 110 is an example of a first switch circuit disposed between the antenna element ANT and the plurality of filters 121 to 124. The switch circuit 110 includes a common terminal 111 and two selection terminals 112 and 113. The switch circuit 110 is an SPDT type switch circuit, and can switch between the electrical connection between the common terminal 111 and the selection terminal 112, and the electrical connection between the common terminal 111 and the selection terminal 113.

The antenna element ANT is connected to the common terminal 111. The selection terminal 112 is connected to a common terminal 141 to which an input terminal or an output terminal of each of the filters 121 and 122 is connected, and the inductor 135. The selection terminal 113 is connected to a common terminal 142 to which an input terminal or an output terminal of each of the filters 123 and 124 is connected, and the inductor 136.

Each of the filters 121 to 124 is a band pass filter having a predetermined frequency range as a pass band and an attenuation band other than the predetermined frequency range. The filter 121 is, for example, a band pass filter in which Band 1 (reception band: 2110 to 2170 MHz) of LTE is set as a pass band. The filter 122 is, for example, a band pass filter in which Band 3 (reception band: 1805 to 1880 MHz) of LTE is set as a pass band. The filter 123 is, for example, a band pass filter in which Band 25 (reception band: 1930 to 1995 MHz) of LTE is set as a pass band. The filter 124 is a band pass filter in which Band 66 (reception band: 2110 to 2200 MHz) of LTE is set as a pass band.

These pass bands are only an example, and each filter may have a desired frequency range as a pass band. For example, any one of the filters 121 to 124 may be a band pass filter in which Band 40 (reception band: 2300 to 2400 MHz) of LTE is set as a pass band. Each of the filters 121 to 124 includes one or more acoustic wave filters, and includes, for example, a SAW filter.

A terminal 121a which is one of the input terminal and the output terminal of the filter 121 is connected to the common terminal 141, and a terminal 121b which is the other terminal is connected to the inductor 131. A terminal 122a which is one of the input terminal and the output terminal of the filter 122 is connected to the common terminal 141, and a terminal 122b which is the other terminal is connected to the inductor 132. A terminal 123a which is one of the input terminal and the output terminal of the filter 123 is connected to the common terminal 142, and a terminal 123b which is the other terminal is connected to the inductor 133. A terminal 124a which is one of the input terminal and the output terminal of the filter 124 is connected to the common terminal 142, and a terminal 124b which is the other terminal is connected to the inductor 134.

The inductor 131 is a matching circuit which is connected to the terminal 121b of the filter 121. Specifically, the inductor 131 is an inductor for impedance matching on an output side or an input side of the filter 121, and is connected in series to a terminal 151 and the terminal 121b of the filter 121.

The inductor 132 is a matching circuit which is connected to the terminal 122b of the filter 122. Specifically, the inductor 132 is an inductor for impedance matching on an output side or an input side of the filter 122, and is connected in series to a terminal 152 and the terminal 122b of the filter 122.

The inductor 133 is a matching circuit which is connected to the terminal 123b of the filter 123. Specifically, the inductor 133 is an inductor for impedance matching on an output side or an input side of the filter 123, and is connected in series to a terminal 153 and the terminal 123b of the filter 123.

The inductor 134 is a matching circuit which is connected to the terminal 124b of the filter 124. Specifically, the inductor 134 is an inductor for impedance matching on an output side or an input side of the filter 124, and is connected in series to a terminal 154 and the terminal 124b of the filter 124.

The inductor 135 is a matching circuit which is connected to the terminal 121a of the filter 121 and the terminal 122a of the filter 122. Specifically, the inductor 135 is an inductor for impedance matching on the input side or the output side of each of the filters 121 and 122, and is connected in parallel to a path connecting the common terminal 141 and the selection terminal 112. Specifically, one terminal of the inductor 135 is connected to the path connecting the common terminal 141 and the selection terminal 112, and the other terminal thereof is connected to the ground.

The inductor 136 is a matching circuit which is connected to the terminal 123a of the filter 123 and the terminal 124a of the filter 124. Specifically, the inductor 136 is an inductor for impedance matching on the input side or the output side of each of the filters 123 and 124, and is connected in parallel to a path connecting the common terminal 142 and the selection terminal 113. Specifically, one terminal of the inductor 136 is connected to the path connecting the common terminal 142 and the selection terminal 113, and the other terminal thereof is connected to the ground.

Each of the terminals 151 to 154 is an output terminal or an input terminal of the high-frequency module 1. The terminals 151 to 154 are connected to an RFIC circuit or the like. An amplifier circuit and a switch circuit may be provided between the terminals 151 to 154 and the RFIC circuit.

When the high-frequency module 1 is used for transmitting a signal, the terminals 151 to 154 are input terminals. In this case, the terminals on a side close to the terminals 151 to 154 between respective terminals of the filters and inductors serve as input terminals, and terminals on a side close to the antenna element ANT serve as output terminals.

On the other hand, when the high-frequency module 1 is used for receiving a signal, the terminals 151 to 154 are output terminals. In this case, between the respective terminals of the filters and inductors, the terminals on the side close to the terminals 151 to 154 serve as output terminals, and the terminals on the side close to the antenna element ANT serve as input terminals.

In the present embodiment, the filters 122 and 123 are an example of a first acoustic wave filter included in the lower stage component 30. The filters 121 and 124 are an example of a second acoustic wave filter included in the upper stage component 40. The inductor 131 connected to the filter 121 is a part of the wiring 50 provided on the upper surface 32 of the lower stage component 30. The inductor 134 connected to the filter 124 is a part of the wiring 50 provided on the upper surface 32 of the lower stage component 30.

Further, the switch circuit 110 is included in the component 80. The inductors 132, 133, 135 and 136 are included in the component 70, or a component mounted on the mounting surface 11 or 12 (not illustrated in FIG. 1). Alternatively, the inductors 132, 133, 135 and 136 may be included in the component 80. That is, the component 70 or the component 80 may be an IC including the switch circuit 110, or may be an IPD or the like including the inductor 132 or the like.

1-3. Terminal and Wiring Layout

Next, a layout of connection terminals and wirings on each surface of the laminated component 20 including a part of the circuit configuration illustrated in FIG. 3 will be described with reference to FIG. 4A to FIG. 4C.

Figure 4A:
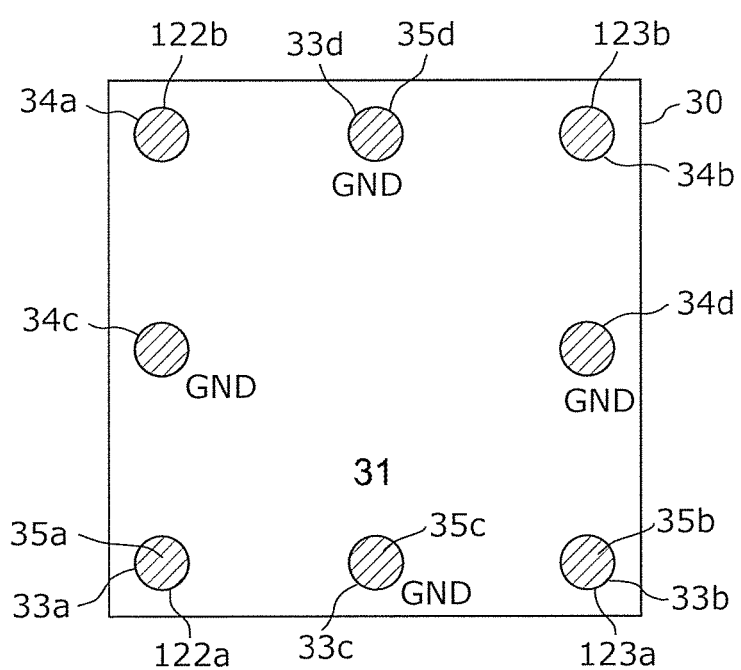
FIG. 4A is a plan view illustrating a lower surface of a lower stage component of the high-frequency module according to the first embodiment.

FIG. 4A is a plan view illustrating the lower surface 31 of the lower stage component 30 of the high-frequency module 1 according to the present embodiment. FIG. 4B is a plan view illustrating the upper surface 32 of the lower stage component 30 of the high-frequency module 1 according to the present embodiment. FIG. 4C is a plan view illustrating the lower surface 41 of the upper stage component 40 of the high-frequency module 1 according to the present embodiment. In each of FIG. 4A to FIG. 4C, connection terminals connected to the surface illustrated in each figure are represented as regions depicted by hatchings diagonally rising to the right. Note that the IDT electrodes of the SAW filters included in the respective components are provided on the lower surfaces 31 and 41 as described above, but the illustration thereof is omitted in order to avoid complication of the figures.

As illustrated in FIG. 4A, the lower stage component 30 is connected to a total of eight connection terminals of four connection terminals 33a to 33d and four connection terminals 34a to 34d. As illustrated in FIG. 4B and FIG. 4C, the upper stage component 40 is connected to a total of six connection terminals of three connection terminals 43a to 43c and three connection terminals 44a to 44c.

Note that each of the connection terminals 33a to 33d is the same as the connection terminal 33 illustrated in FIG. 1, and a position thereof on the lower surface 31 and a position thereof in the circuit are different from each other. The same applies to the connection terminals 34a to 34d, 43a to 43c, and 44a to 44c.

The connection terminal 33a is the terminal (first terminal) 122a which is one terminal of the input terminal and the output terminal of the filter 122. The connection terminal 34a is the terminal 122b which is the other terminal of the input terminal and the output terminal of the filter 122. Although not illustrated in FIG. 4A, in the present embodiment, an IDT electrode configuring the filter 122 is provided between the connection terminal 33a and the connection terminal 34a on the lower surface 31.

The connection terminal 33b is the terminal (first terminal) 123a which is one terminal of the input terminal and the output terminal of the filter 123. The connection terminal 34b is the terminal 123b which is the other terminal of the input terminal and the output terminal of the filter 123. Although not illustrated in FIG. 4A, in the present embodiment, an IDT electrode configuring the filter 123 is provided between the connection terminal 33b and the connection terminal 34b on the lower surface 31.

The connection terminal 44a is the terminal (second terminal) 121a which is one terminal of the input terminal and the output terminal of the filter 121. The connection terminal 43a is the terminal 121b which is the other terminal of the input terminal and the output terminal of the filter 121. Although not illustrated in FIG. 4C, in the present embodiment, an IDT electrode configuring the filter 121 is provided between the connection terminal 44a and the connection terminal 43a on the lower surface 41.

The connection terminal 44b is the terminal (second terminal) 124a which is one terminal of the input terminal and the output terminal of the filter 124. The connection terminal 43b is the terminal 124b which is the other terminal of the input terminal and the output terminal of the filter 124. Although not illustrated in FIG. 4C, in the present embodiment, an IDT electrode configuring the filter 124 is provided between the connection terminal 44b and the connection terminal 43b on the lower surface 41.

The connection terminals 33c and 33d, the connection terminals 34c and 34d, and the connection terminals 43c and 44c are terminals individually connected to the ground.

The via conductor 35 is connected to each of the four connection terminals 33a to 33d. That is, the lower stage component 30 is provided with four via conductors 35a to 35d. Note that each of the via conductors 35a to 35d is the same as the via conductor 35 illustrated in FIG. 1, and a position thereof in the lower stage component 30 and a position thereof in the circuit are different from each other.

As illustrated in FIG. 4A, the lower end surfaces of the via conductors 35a to 35d are exposed to the lower surface 31. As illustrated in FIG. 4B, the upper end surfaces of the via conductors 35a to 35d are exposed to the upper surface 32. The via conductor 35 is not connected to each of the four connection terminals 34a to 34d.

Figure 4B:
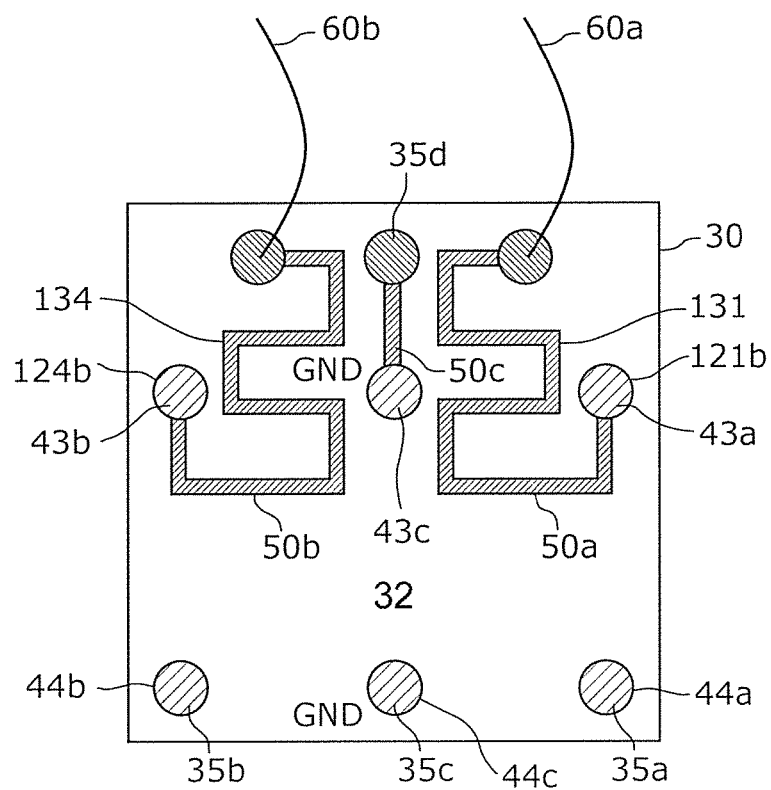
FIG. 4B is a plan view illustrating an upper surface of the lower stage component of the high-frequency module according to the first embodiment.
Figure 4C:
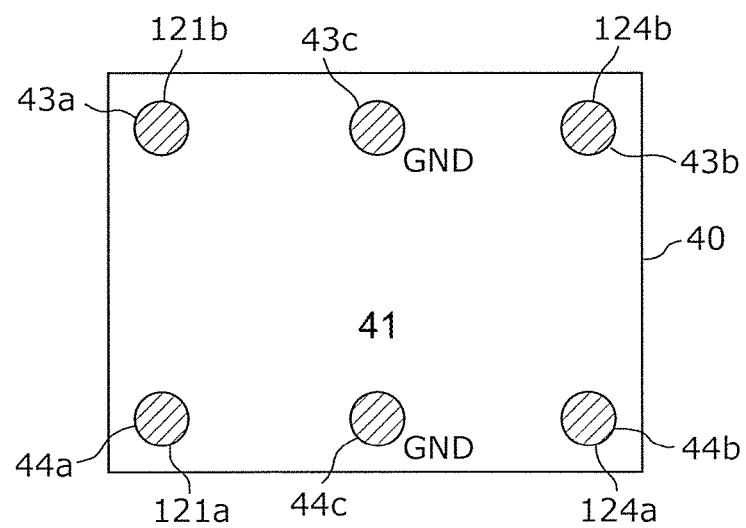
FIG. 4C is a plan view illustrating a lower surface of an upper stage component of the high-frequency module according to the first embodiment.

As illustrated in FIG. 4A to FIG. 4C, the connection terminal 33a and the connection terminal 44a are connected to each other with the via conductor 35a interposed therebetween. That is, the terminal (first terminal) 122a of the filter 122 and the terminal (second terminal) 121a of the filter 121 are electrically connected to each other in the laminated component 20. As a result, a connection wiring to the common terminal 141 of the filters 121 and 122 can be shortened, so that a resistance component, an inductor component, and a capacitance component that are unnecessary can be reduced, and the filter characteristics can be improved. Further, since the connection terminal 44a and the substrate 10 can be electrically connected to each other with the connection terminal 33a interposed therebetween, it is possible to reduce the number of terminals to be provided on the lower surface 31 of the lower stage portion 30. That is, since it is not necessary to provide a dedicated terminal for electrical connection to the connection terminal 44a on the lower surface 31, it is possible to reduce an area of the lower surface 31.

Similarly, the connection terminal 33b and the connection terminal 44b are connected to each other with the via conductor 35b interposed therebetween. That is, the terminal (first terminal) 123a of the filter 123 and the terminal (second terminal) 124a of the filter 124 are electrically connected to each other in the laminated component 20. As a result, as in a case with the filters 121 and 122, it is possible to improve the filter characteristics and to reduce the area of the lower surface 31 due to the reduction in the number of terminals.

Further, the connection terminals 33c and 33d connected to the ground and the connection terminals 43c and 44c are connected with the via conductors 35c and 35d and a wiring 50c interposed therebetween, whereby the grounding of the upper stage component 40 can be made stronger than that in a case where the connection is made by wire bonding. For example, since the via conductors 35c and 35d having lower resistivity than a wire can be used, the influence of the wiring resistance or the like can be sufficiently reduced, and the grounding of the upper stage component 40 can be enhanced.

Further, the electrical connection between each of the connection terminals 44c and 43c, for grounding, of the upper stage component 40 and the substrate 10 can be performed with the connection terminals 33c and 33d interposed therebetween, so that the number of terminals provided on the lower surface 31 of the lower stage component 30 can be reduced. In other words, since it is not necessary to provide a dedicated terminal for the electrical connection with the connection terminals 44c and 43c on the lower surface 31, it is possible to reduce the area of the lower surface 31.

In the present embodiment, as illustrated in FIG. 4B, wirings 50a to 50c are provided on the upper surface 32 of the lower stage component 30. Wires 60a and 60b are connected to the end portions of the wiring 50a and 50b, respectively. Note that each of the wirings 50a to 50c is the same as the wiring 50 illustrated in FIG. 1, and a position thereof in the upper surface 32 is different from a position in the circuit. Each of the wires 60a and 60b is the same as the wire 60 illustrated in FIG. 1 and a position thereof in the upper surface 32 and a position thereof in the circuit are different from each other.

The wiring 50a connects the connection terminal 43a which is the terminal 121b of the filter 121, to the wire 60a. A part of the wiring 50a is the inductor 131. That is, the wiring 50a includes the inductor 131 which is a matching circuit of the filter 121 included in the upper stage component 40.

The wiring 50b connects the connection terminal 43b which is the terminal 124b of the filter 124, to the wire 60b. A part of the wiring 50b is the inductor 134. That is, the wiring 50b includes the inductor 134 which is a matching circuit of the filter 124 included in the upper stage component 40.

The wiring 50c connects the via conductor 35d to the connection terminal 43c. The wiring 50c is a wiring for grounding the upper stage component 40.

In this manner, the connection terminal 43a of the upper stage component 40 is led out to an outer portion of the laminated component 20 via the wiring 50a and the wire 60a. In other words, since it is unnecessary to provide a dedicated terminal for the electrical connection to the connection terminal 43a of the upper stage component 40 on the lower surface 31 of the lower stage component 30, it is possible to reduce the area of the lower surface 31. The same applies to the connection terminal 43b of the upper stage component 40. According to the high-frequency module 1 of the present embodiment, it is possible to reduce the necessary total number of connection terminals from the 14 connection terminals to the 8 connection terminals in both the lower stage component 30 and the upper stage component 40. Since the number of connection terminals can be significantly reduced, the area of the lower surface 31 of the lower stage component 30 can be reduced. Miniaturization of the lower stage component 30 can lead to miniaturization of the high-frequency module 1.

In the present embodiment, in a plan view of the mounting surface 11 of the substrate 10, the upper stage component 40 overlaps the lower stage component 30. In this case, a part of the upper surface 32 of the lower stage component 30 is exposed without being covered by the upper stage component 40. At least a part of each of the wirings 50a and 50b is provided in a portion, on the upper surface 32, which is not covered by the upper stage component 40. As a result, the wires 60a and 60b can be easily connected.

Further, in this embodiment, by using the upper surface 32 facing the lower surface 31 back to back which is a functional surface of the lower stage component 30, an element (specifically, the inductor 131 or the like) which is related to a function of the upper stage component 40 can be provided. As a result, the number of components to be mounted on the substrate 10 can be reduced, so that the reduction in the area of the substrate 10 can be achieved, thereby achieving the reduction in the size of the high-frequency module 1.

1-4. Modification

Next, a modification of the present embodiment will be described. Hereinafter, the differences from the first embodiment will be mainly described, and the description of the common points will be omitted or simplified.

Figure 5:
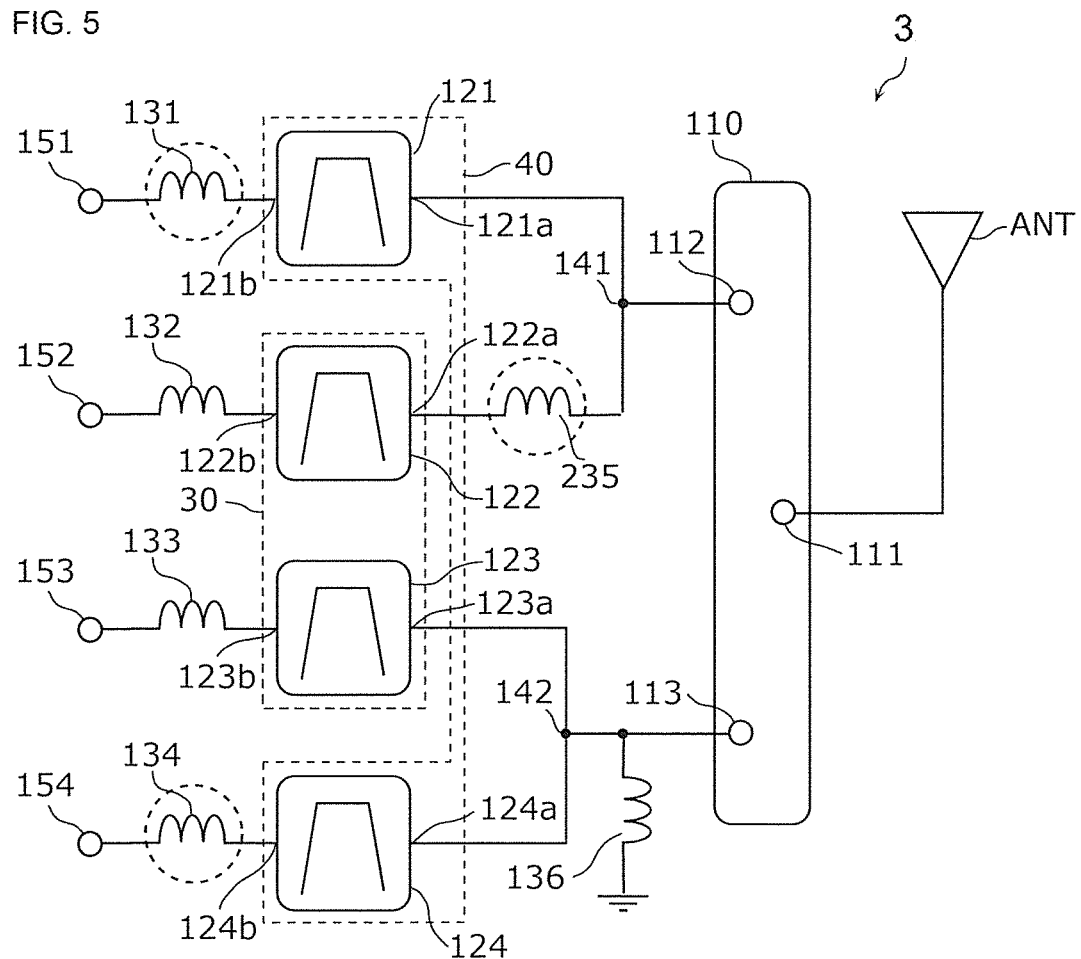
FIG. 5 is a circuit diagram illustrating a circuit configuration of a high-frequency module according to a modification of the first embodiment.

FIG. 5 is a circuit diagram illustrating a circuit configuration of a high-frequency module 3 according to the present modification. As illustrated in FIG. 5, the high-frequency module 3 differs from the high-frequency module 1 illustrated in FIG. 3 in that an inductor 235 is provided instead of the inductor 135.

The inductor 235 is a matching circuit which is connected to the terminal 122a of the filter 122. Specifically, the inductor 235 is an inductor for impedance matching of the input side or the output side at the filter 122, and is connected in series to the common terminal 141 and the terminal 122a.

In this modification, the inductor 235 is a part of the wiring 50 provided on the upper surface 32 of the lower stage component 30. A layout of connection terminals and wirings on each surface of the laminated component 20 of the high-frequency module 3 according to the present modification will be described with reference to FIG. 6A to FIG. 6C.

Figure 6A:
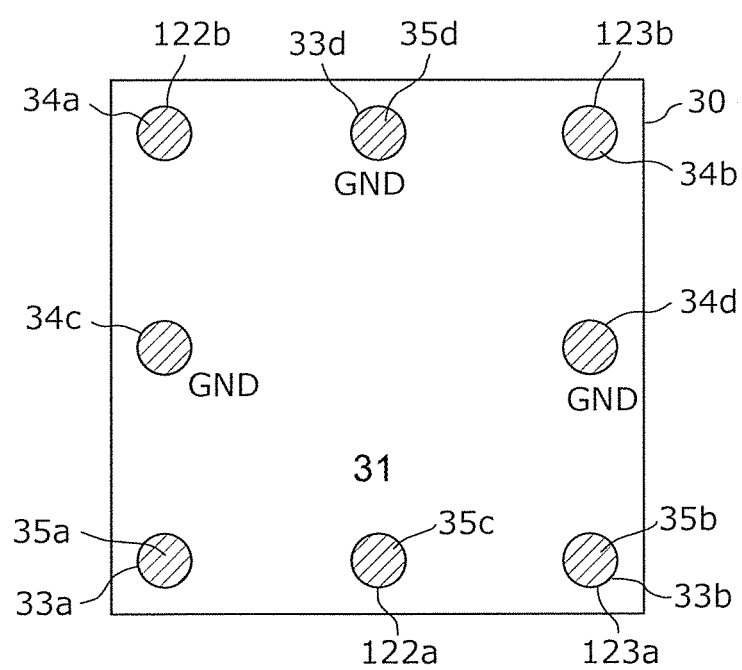
FIG. 6A is a plan view illustrating a lower surface of a lower stage component of the high-frequency module according to the modification of the first embodiment.
Figure 6B:
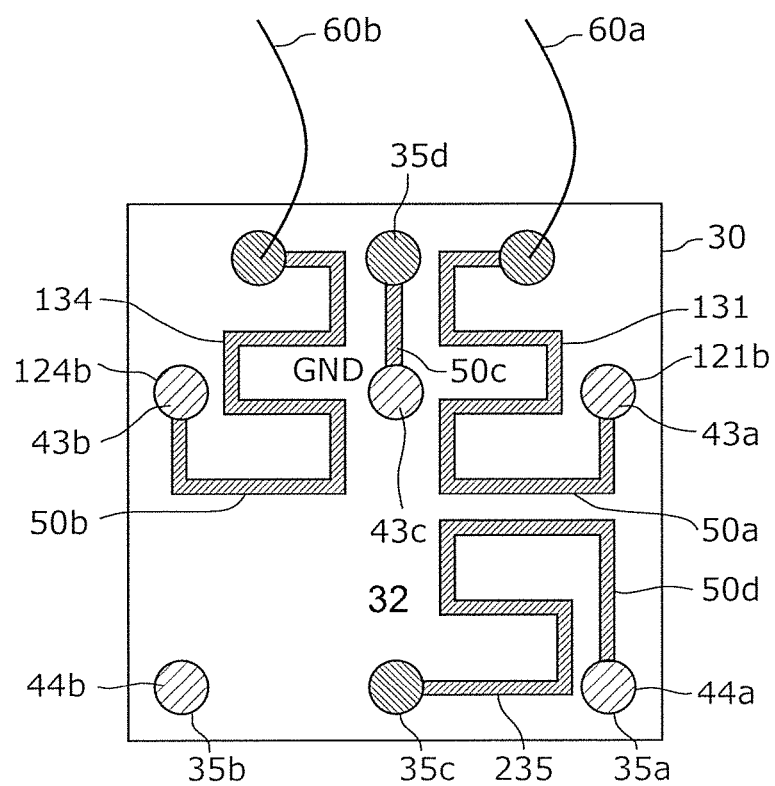
FIG. 6B is a plan view illustrating an upper surface of the lower stage component of the high-frequency module according to the modification of the first embodiment.
Figure 6C:
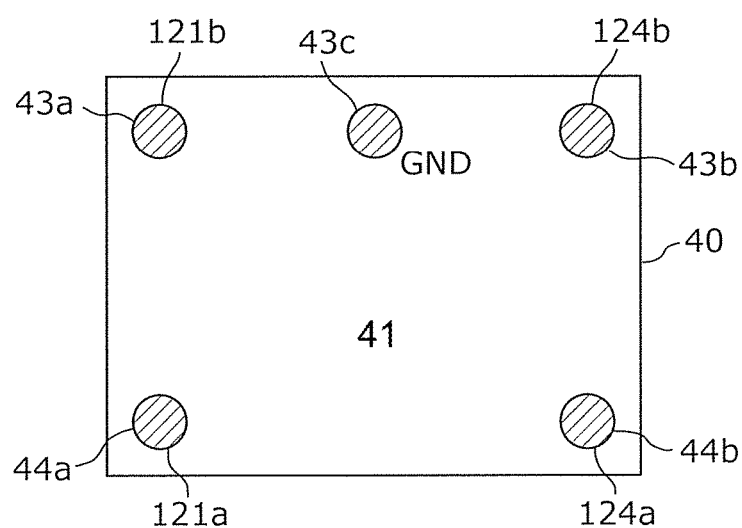
FIG. 6C is a plan view illustrating a lower surface of an upper stage component of the high-frequency module according to the modification of the first embodiment.

FIG. 6A is a plan view illustrating the lower surface 31 of the lower stage component 30 of the high-frequency module 3 according to the present modification. FIG. 6B is a plan view illustrating the upper surface 32 of the lower stage component 30 of the high-frequency module 3 according to the present modification. FIG. 6C is a plan view illustrating the lower surface 41 of the upper stage component 40 of the high-frequency module 3 according to the present modification.

As can be seen from respective comparisons between FIG. 6A to FIG. 6C and FIG. 4A to FIG. 4C, a layout of the high-frequency module 3 according to the present modification is mainly different from a layout of the high-frequency module 1 according to the first embodiment in the following points.

First, as illustrated in FIG. 6A, a position of the terminal 122a of the filter 122 in the high-frequency module 3 according to the present modification is different from that in the high-frequency module 1. Specifically, the terminal 122a corresponds to a lower end portion of the via conductor 35c. Further, as illustrated in FIG. 6B, the upper surface 32 of the lower stage component 30 is newly provided with a wiring 50d. As illustrated in FIG. 6C, the lower surface 41 of the upper stage component 40 is not provided with the connection terminal 44c.

As illustrated in FIG. 6B, the wiring 50d connects an upper end portion of the via conductor 35a and an upper end portion of the via conductor 35c. A part of the wiring 50d is the inductor 235. That is, the wiring 50d includes the inductor 235 which is a matching circuit of the filter 122 included in the lower stage component 30.

In this modification, the connection terminal 33a of the lower stage component 30 is connected to the terminal 122a of the filter 122 with the via conductor 35a, the wiring 50d, and the via conductor 35c interposed therebetween. Additionally, the connection terminal 33a is connected to the terminal 121a of the filter 121 of the upper stage component 40 with the via conductor 35a and the connection terminal 44a of the upper stage component 40 interposed therebetween. That is, the connection terminal 33a and the via conductor 35a correspond to the common terminal 141 in the circuit configuration illustrated in FIG. 5.

In this manner, the via conductor 35c functions as a path for connecting the filter 122 of the lower stage component 30 and the inductor 235. Since the via conductor 35c is not used for grounding the upper stage portion 40, as illustrated in FIG. 6B and FIG. 6C, the connection terminal 44c for connecting the via conductor 35c and the upper stage component 40 is not provided. Note that in order to enhance the grounding of the upper stage component 40, a via conductor and a connection terminal for grounding connection may be provided at a position different from that of the via conductor 35c.

1-5. Effects and the Like

As described above, the high-frequency module 1, 2, or 3 according to the present embodiment or the modification includes the substrate 10 having the mounting surface 11, the laminated component 20 disposed on the mounting surface 11, and the wiring 50. The laminated component 20 includes the lower stage component 30 and an upper stage component 40 disposed on the lower stage component 30. The lower stage component 30 has the lower surface 31 facing the mounting surface 11, the upper surface 32 facing the lower surface 31 back to back, and the connection terminal 33 provided on the lower surface 31. The upper stage component 40 has the lower surface 41 facing the upper surface 32 and the connection terminal 43 provided on the lower surface 41. The wiring 50 is provided on the lower surface 41, and is connected with the connection terminal 43.

Therefore, since the connection terminal 43 of the upper stage component 40 located on an upper side is connected to the wiring 50 provided on the upper surface 32 of the lower stage component 30 located on a lower side, the connection from the wiring 50 to other components or the substrate 10 can be made. For example, by connecting the wiring 50 and other components or the substrate 10 with a wire or the like, it is unnecessary to provide a connection terminal for the upper stage component 40 on the lower stage component 30.

As described above, according to the high-frequency module 1, 2, or 3 according to the present embodiment or the modification, the number of connection terminals provided on the lower surface 31 of the lower stage component 30 can be reduced. Since the number of terminals of the lower stage component 30 is reduced, a space for providing the connection terminals can be reduced, so that the size of the lower stage portion 30 can be reduced. Therefore, it is possible to achieve the miniaturization of the high-frequency module 1, 2, or 3.

Further, by reducing the number of terminals, the degree of freedom in designing the layout of the circuit and the terminals of the lower stage component 30 can also be increased. For example, a circuit for exhibiting the function of the lower stage component 30 (for example, an IDT electrode of the SAW filter) or a connection terminal of the lower stage component 30 may be provided in an empty space.

In addition, for example, the wiring 50 is connected to the mounting surface 11 or the component 70 which is provided on the mounting surface 11 and which is different from the lower stage component 30 and the upper stage component 40, by wire bonding.

Thus, the lower stage portion 30 does not have to be provided with the connection terminal for the upper stage component 40, so that the number of terminals of the lower stage component 30 can be reduced. Since the size of the lower stage portion 30 can be reduced by reducing the number of terminals, the size of the high-frequency module 1, 2, or 3 can be reduced.

Further, for example, the lower stage component 30 may include a first acoustic wave filter, and the upper stage component 40 may include a second acoustic wave filter. The first terminal which is an input terminal or an output terminal of the first acoustic wave filter and the second terminal which is an input terminal or an output terminal of the second acoustic wave filter may be electrically connected to each other in the laminated component 20.

Thus, the terminals of the filters can be commonly connected in the laminated component 20. Since a length of wiring in the common wiring portion which is susceptible to characteristic deterioration can be reduced, deterioration in characteristics can be effectively suppressed.

Further, for example, at least a part of the wiring 50 is an inductor. The inductor is a matching circuit connected to the input terminal or the output terminal of either the first acoustic wave filter or the second acoustic wave filter.

Thus, for example, an input impedance and an output impedance with respect to the filter 122 can be matched, so that a signal loss can be reduced.

Further, for example, since the inductor 131 disposed on the substrate 10 in many cases can be disposed on the upper surface 32 of the lower stage component 30, the high-frequency module 1, 2, or 3 can be miniaturized. Further, the inductor 131 provided on the upper surface 32 of the lower stage component 30 is hardly affected by capacitive deterioration due to coupling with the other components. Therefore, deterioration in characteristics due to generation of an unnecessary capacitance component can be suppressed.

Also, for example, the lower stage component 30 may include the first acoustic wave filter or may be a first integrated circuit or a first integrated passive device. The upper stage component 40 may include the second acoustic wave filter or may be a second integrated circuit or a second integrated passive device.

Thereby, a plurality of elements having different functions can be laminated, so that a mounting area of the substrate 10 can be reduced.

Additionally, for example, the lower stage component 30 further includes the via conductor 35 extending through the lower stage component 30. The via conductor 35 electrically connects the connection terminal 33 and the connection terminal 44 of the upper stage component 40.

Thus, the connection terminal 33 and the connection terminal 44 can be commonly connected. Since a length of wiring in the common wiring portion which is susceptible to characteristic deterioration can be reduced, deterioration in characteristics can be effectively suppressed.

In addition, for example, the substrate 10 has the mounting surface 12 facing the mounting surface 11 back to back. The high-frequency module 1, 2, or 3 further includes the component 80 (the third integrated circuit) provided on the mounting surface 12.

As a result, a space on a mounting surface 12 side of the substrate 10 can be effectively utilized, so that the area of the substrate 10 can be reduced.

Second Embodiment

Next, the second embodiment will be described. The second embodiment differs from the first embodiment in that a high-frequency module is provided with a plurality of laminated components. Hereinafter, the differences from the first embodiment and the modification thereof will be mainly described, and the description of the common points will be omitted or simplified.

2-1. Configuration

Figure 7:
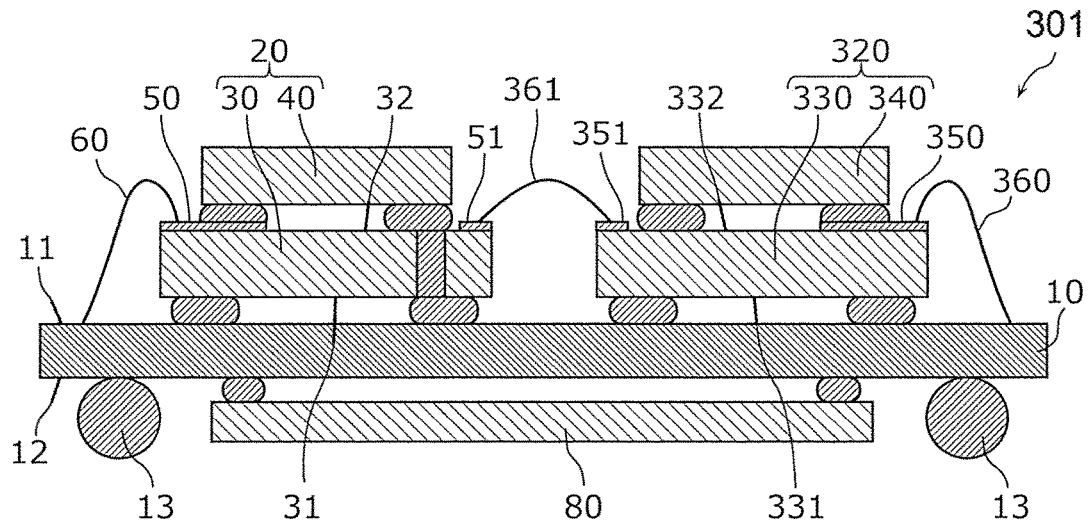
FIG. 7 is a cross-sectional view illustrating a configuration of a high-frequency module according to a second embodiment.

FIG. 7 is a cross-sectional view of a high-frequency module 301 according to the present embodiment. As illustrated in FIG. 7, the high-frequency module 301 newly includes a laminated component 320 as compared to the high-frequency module 1 according to the first embodiment. Note that the high-frequency module 301 illustrated in FIG. 7 may include the component 70, the cap member 90, and the encapsulating member 91 illustrated in FIG. 1.

In addition, FIG. 7 illustrates two connection terminals 13 for mounting the high-frequency module 301 on another mounting substrate. The two connection terminals 13 are, for example, an input terminal and an output terminal with respect to the high-frequency module 301. One of the two connection terminals 13 is connected to, for example, the antenna element ANT, and the other is connected to, for example, an RFIC circuit.

The laminated component 320 is an example of a second laminated component, and has a laminated structure of a plurality of circuit components. Specifically, the laminated component 320 is disposed on the mounting surface 11, and includes a lower stage component 330 and an upper stage component 340.

The lower stage component 330 is an example of a third component, and is disposed on the mounting surface 11. The lower stage component 330 has a lower surface 331 and an upper surface 332. The lower surface 331 is an example of a fourth surface facing the mounting surface 11. The upper surface 332 is an example of a fifth surface facing the lower surface 331 back to back. The lower stage component 330 has one or more connection terminals provided on the lower surface 331.

The upper stage component 340 is an example of a fourth component disposed on the lower stage component 330. The upper stage component 340 includes one or more connection terminals provided on a lower surface thereof.

For example, the laminated component 320 has the same configuration as that of the laminated component 20 according to the first embodiment. Specifically, the lower stage component 330 and the upper stage component 340 correspond to the lower stage component 30 and the upper stage component 40 according to the first embodiment, respectively. For example, a via conductor may be provided in the lower stage component 330.

In the laminated component 320, a wiring 350 provided on the upper surface 332 of the lower stage component 330 and the mounting surface 11 of the substrate 10 are electrically connected by a wire 360. The wiring 350 and the wire 360 correspond to the wiring 50 and the wire 60 according to the first embodiment, respectively.

Note that the laminated component 320 may have a configuration different from that of the laminated component 20. For example, the laminated component 320 may not have the via conductor 35. In addition, the wire 360 may not be connected to the lower stage component 330 of the laminated component 320. All of the connection terminals of the upper stage component 340 may be provided on the lower surface 331 of the lower stage component 330.

In this embodiment, as illustrated in FIG. 7, a wiring 51 is further provided on the upper surface 32 of the lower stage component 30 of the laminated component 20. A wiring 351 which is an example of a second wiring is further provided on the upper surface 332 of the lower stage component 330 of the laminated component 320. The high-frequency module 301 further includes a wire 361 for connecting the wiring 51 and the wiring 351.

The wiring 51 is an example of the first wiring which is connected to the connection terminal of the upper stage component 40. Alternatively, the wiring 51 may not be connected to the connection terminal of the upper stage component 40, or may be connected to the via conductor provided in the lower stage component 30. The wiring 51 may not be connected to either the connection terminal of the upper stage component 40 or the via conductor, and may not be a part of the wiring in the circuits included in the lower stage component 30 and the upper stage component 40.

The wiring 351 is connected to the via conductor provided in the lower stage component 330 or to the connection terminal of the upper stage component 340. Alternatively, the wiring 351 may not be connected to both the via conductor and the connection terminal, and may not be a part of the wiring in the circuits included in the lower stage component 330 and the upper stage component 340.

The wire 361 is a bonding wire for electrically connecting the wiring 51 and the wiring 351. The wire 361 is, for example, a wire formed using a metal material such as gold, copper or aluminum.

Figure 8:
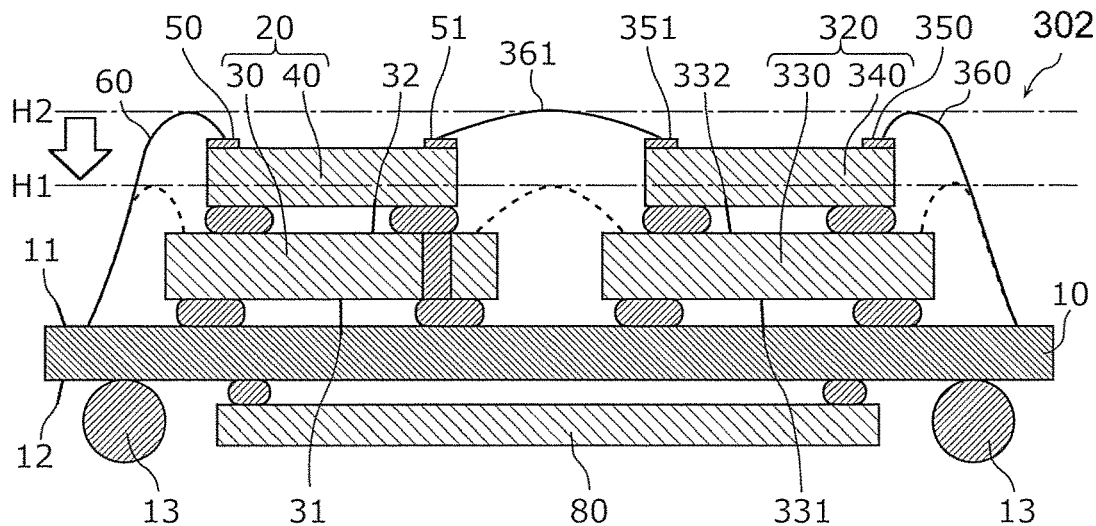
FIG. 8 is a cross-sectional view for explaining the reduction in the height of the high-frequency module according to the second embodiment.

In this manner, in the present embodiment, when the laminated components are connected to each other by wire bonding, the upper surfaces of the lower stage components of the laminated components are connected to each other with the wire 361. As a result, as illustrated in FIG. 8, it is possible to lower a height of the wire 361 as compared to a case where the upper surfaces of the upper stage components of the laminated components are connected to each other. FIG. 8 is a cross-sectional view for explaining the reduction in the height of the high-frequency module 301 according to the present embodiment. FIG. 8 illustrates a high-frequency module 302 in which the wire 361 connects the upper surfaces of the upper stage components. As illustrated in FIG. 8, when the wire 361 connects the upper surfaces of the lower stage components, a highest point H1 which is a point at which the wire 361 is farthest from the substrate 10 becomes lower than a highest point H2 of the wire 361 when the wire 361 connects the upper surfaces of the upper stage components. In this manner, since the wire 361 can be brought close to the substrate 10, the height of the high-frequency module 301 can be reduced.

In the high-frequency module 301, each of the lower stage component 30, the upper stage component 40, the lower stage component 330, and the upper stage component 340 includes an acoustic wave filter, or is an IC or an IPD. Hereinafter, an example of a specific circuit configuration of the high-frequency module 301 of the present embodiment and correspondence among respective elements and respective components included in the circuit will be described with reference to FIG. 9.

Figure 9:
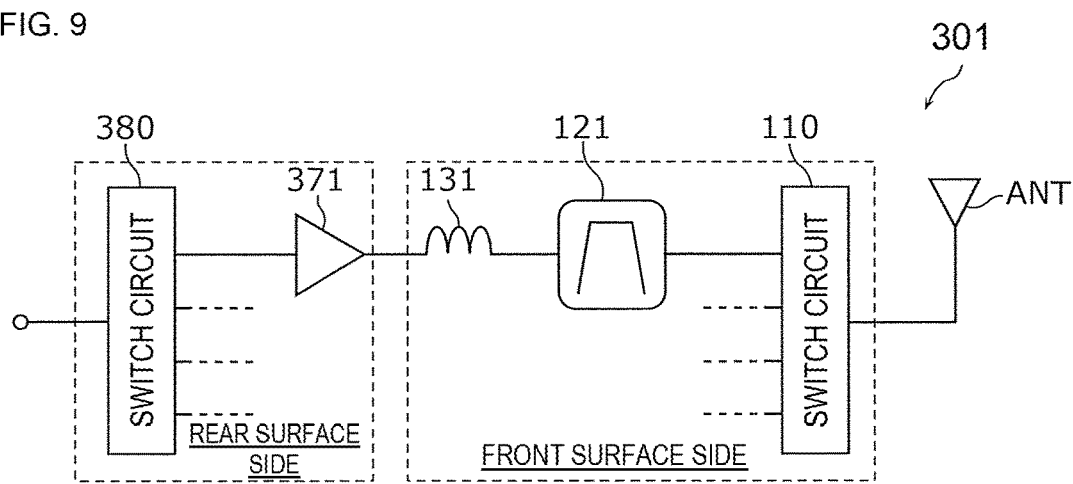
FIG. 9 is a circuit diagram illustrating a circuit configuration of the high-frequency module according to the second embodiment.

FIG. 9 is a circuit diagram illustrating a circuit configuration of the high-frequency module 301 according to the present embodiment. As illustrated in FIG. 9, the high-frequency module 301 includes the switch circuit 110, the filter 121, the inductor 131, an amplifier circuit 371, and a switch circuit 380. Although not illustrated in FIG. 9, a plurality of sets, each of which includes a filter, an inductor and an amplifier circuit, is provided between the switch circuit 110 and the switch circuit 380, similarly to a set of the filter 121, the inductor 131 and the amplifier circuit 371. Note that a matching circuit for impedance matching may be provided between the filter 121 and the switch circuit 110 and between the switch circuit 110 and the antenna element ANT.

The switch circuit 110, the filter 121, and the inductor 131 are the same as the switch circuit 110, the filter 121, and the inductor 131 described in the first embodiment, respectively. Note that the number of selection terminals included in the switch circuit 110 is not limited to two, and may be three or may be four or more.

The amplifier circuit 371 is connected between the switch circuit 380 and the filter 121. Specifically, the amplifier circuit 371 is connected in series to the switch circuit 380 and the inductor 131. The amplifier circuit 371 is, for example, a low noise amplifier (LNA) to be used in a reception circuit for a signal. The amplifier circuit 371 amplifies and outputs a signal that is inputted from an inductor 131 side. Alternatively, the amplifier circuit 371 may be a power amplifier (PA) to be used in a transmission circuit for a signal. When the amplifier circuit 371 is the power amplifier, the amplifier circuit 371 amplifies a signal that is inputted from a switch circuit 380 side.

The switch circuit 380 is an example of a second switch circuit. The switch circuit 380 has the same configuration as that of the switch circuit 110, for example. Specifically, the switch circuit 380 includes a common terminal and a plurality of selection terminals, and can switch electrical connection between the common terminal and each selection terminal. The common terminal of the switch circuit 380 is connected to, for example, an RFIC or the like.

In this embodiment, as illustrated in FIG. 9, the switch circuit 110, the filter 121, and the inductor 131 are disposed on a front surface side of the substrate 10, that is, on a mounting surface 11 side. For example, the switch circuit 110 is included in an IC (first integrated circuit) which is one of the lower stage components 30 and 330. The filter 121 is included in, for example, the upper stage component 40. The inductor 131 is included in the wiring 50 to which the connection terminal 43 of the upper stage component 40 is connected. Other filters and inductors not illustrated in FIG. 9 are included in the other of the lower stage components 30 and 330, or in the upper stage component 340. Note that the switch circuit 110 may be included in an IC (second integrated circuit) which is the upper stage component 40. The inductor 131 may be an IPD (first integrated passive device) which is the lower stage component 30, or an IPD (second integrated passive device) which is the upper stage component 40.

Additionally, the amplifier circuit 371 and the switch circuit 380 are disposed on a rear surface side of the substrate 10, that is, on a mounting surface 12 side. Specifically, the amplifier circuit 371 and the switch circuit 380 are included in an IC (third integrated circuit) which is the component 80.

In this manner, since the switch circuit 110 and the filter 121 are disposed on the mounting surface 11 side of the substrate 10, a wiring length connecting the switch circuit 110 and the filter 121 can be shortened. Thereby, unnecessary inductor components or capacitor components generated in the wiring can be reduced, so that the deterioration of the filter characteristics can be suppressed.

2-2. Effects and the Like

As described above, the high-frequency module 301 according to the present embodiment includes, for example, the laminated component 320 disposed on the mounting surface 11. The laminated component 320 includes the lower stage component 330 and the upper stage component 340 disposed on the lower stage component 330. The lower stage component 330 includes the lower surface 331 facing the mounting surface 11, the upper surface 332 facing the lower surface 331 back to back, and the wiring 351 provided on the upper surface 332. The wiring 351 is connected to the wiring 51 provided on the upper surface 32 by wire bonding.

Thus, the upper surfaces of the lower stage components configuring the laminated components can be connected to each other by wire bonding, so that the height of the high-frequency module 301 can be reduced as compared with a case where the upper surfaces of the upper stage components are connected to each other.

Additionally, for example, the high-frequency module 301 includes an acoustic wave filter, the switch circuit 110 disposed between the antenna element ANT and the acoustic wave filter, the switch circuit 380, the amplifier circuit 371 disposed between the switch circuit 380 and the acoustic wave filter, and a matching circuit disposed between the acoustic wave filter and the amplifier circuit 371. The acoustic wave filter, the switch circuit 110, and the matching circuit are disposed on the mounting surface 11 side. The acoustic wave filter is included in the lower stage component 30 or the upper stage component 40. The amplifier circuit 371 and the switch circuit 380 are included in the third integrated circuit.

Thus, for example, since the switch circuit 110 and the filter 121 are disposed on the mounting surface 11 side of the substrate 10, the wiring length connecting the switch circuit 110 and the filter 121 can be shortened. Thereby, unnecessary inductor components or capacitor components generated in the wiring can be reduced, so that the deterioration of the filter characteristics can be suppressed.

2-3. Modification

Next, a modification of the second embodiment will be described. Hereinafter, the differences from the second embodiment will be mainly described, and the description of the common points will be omitted or simplified.

Figure 10:
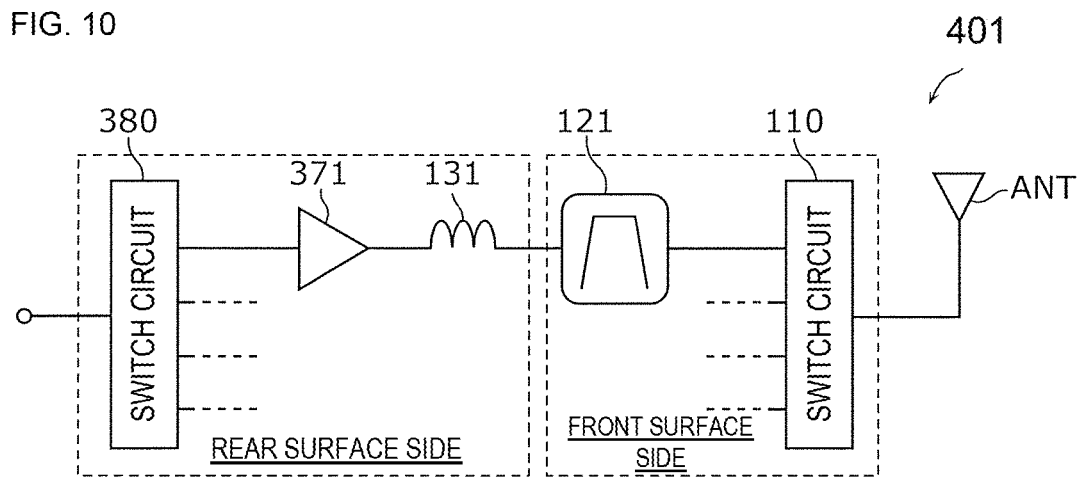
FIG. 10 is a circuit diagram illustrating a circuit configuration of a high-frequency module according to a modification of the second embodiment.

FIG. 10 is a circuit diagram illustrating a circuit configuration of a high-frequency module 401 according to the present modification. As illustrated in FIG. 10, the circuit configuration of the high-frequency module 401 according to this modification is the same as the circuit configuration of the high-frequency module 301 according to the second embodiment. The high-frequency module 401 according to the present modification is different in that the inductor 131 is provided on the rear surface side, that is, on the mounting surface 12 side, rather than on the front surface side of the substrate 10.

Figure 11:
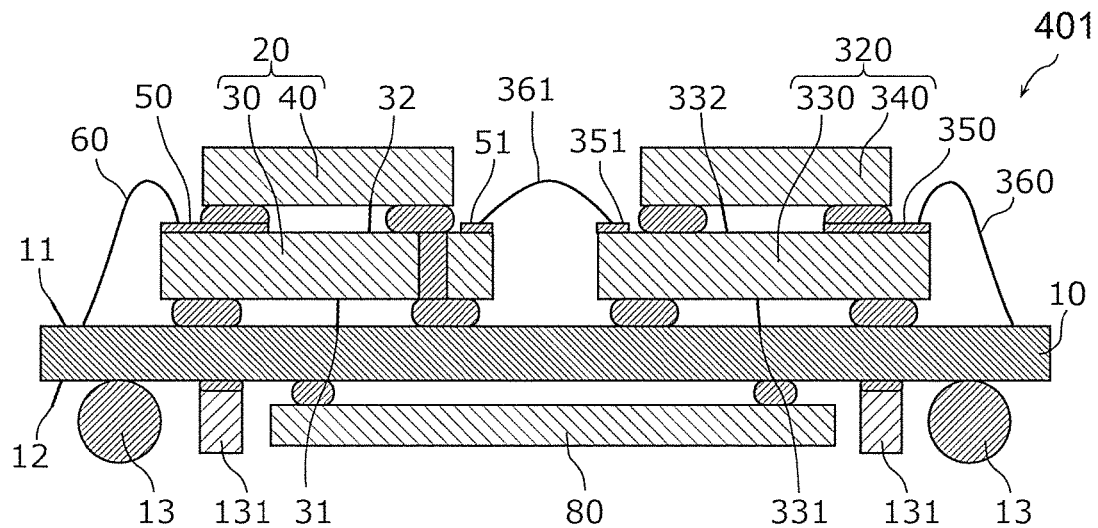
FIG. 11 is a cross-sectional view illustrating a configuration of the high-frequency module according to the modification of the second embodiment.

FIG. 11 is a cross-sectional view illustrating a configuration of the high-frequency module 401 according to the present modification. As illustrated in FIG. 11, components including the inductor 131 are disposed on the mounting surface 12 side of the substrate 10. Note that the inductor 131 may be included in the component 80.

In this manner, in the high-frequency module 401 according to the present modification, the matching circuit is disposed on the mounting surface 12 side.

As a result, the amplifier circuit 371 and the inductor 131 which is a matching circuit are disposed on the mounting surface 12 side of the substrate 10, so that a wiring length connecting the amplifier circuit 371 and the inductor 131 can be shortened. Accordingly, parasitic capacitance between the amplifier circuit 371 and the inductor 131 can be reduced, so that gain and noise figure (NF) characteristics can be enhanced.

Third Embodiment

Next, the third embodiment will be described. The third embodiment is different from the first embodiment in that the laminated component is provided with a plurality of upper stage components. Hereinafter, the differences from the first and second embodiments will be mainly described, and the description of the common points will be omitted or simplified.

3-1. Configuration

Figure 12:
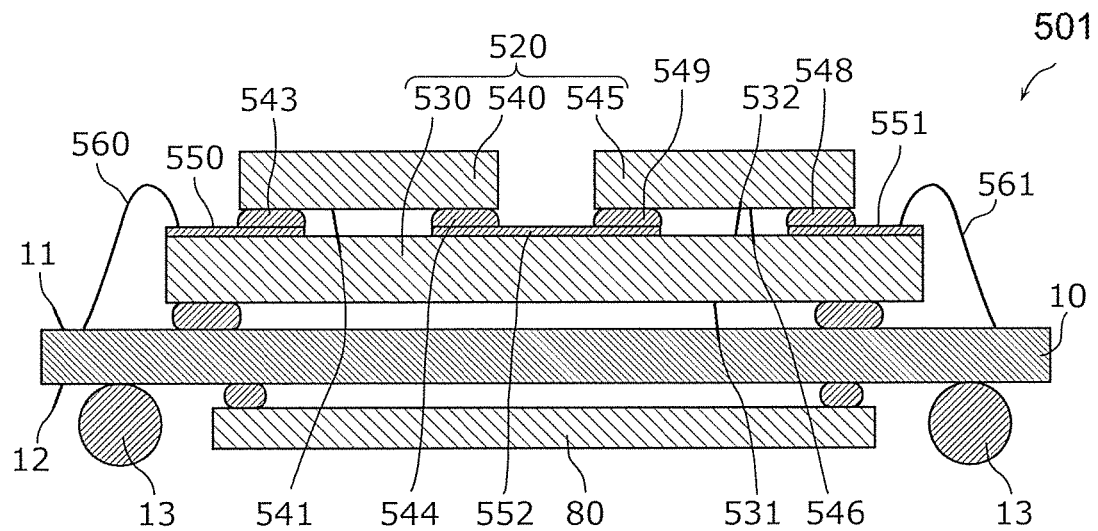
FIG. 12 is a cross-sectional view illustrating a configuration of a high-frequency module according to a third embodiment.

FIG. 12 is a cross-sectional view illustrating a configuration of a high-frequency module 501 according to the present embodiment. As illustrated in FIG. 12, the high-frequency module 501 is different from the high-frequency module 1 according to the first embodiment in that a laminated component 520 is provided instead of the laminated component 20. Note that the high-frequency module 501 illustrated in FIG. 12 may include the component 70, the cap member 90, and the encapsulating member 91 illustrated in FIG. 1. Similarly to the high-frequency module 301 according to the second embodiment, the high-frequency module 501 includes two connection terminals 13.

The laminated component 520 is an example of the first laminated component, and has a laminated structure of a plurality of circuit components. Specifically, as illustrated in FIG. 12, the laminated component 520 is disposed on the mounting surface 11, and includes a lower stage component 530 and upper stage components 540 and 545. That is, in the present embodiment, the laminated component 520 includes a plurality of upper stage components.

The lower stage component 530 is an example of the first component, and is disposed on the mounting surface 11. The lower stage component 530 has a lower surface 531 and an upper surface 532. The lower surface 531 is an example of the first surface facing the mounting surface 11. The upper surface 532 is an example of the second surface facing the lower surface 531 back to back. The lower stage component 530 has one or more connection terminals provided on the lower surface 531. The lower stage component 530 is, for example, an IC. Alternatively, the lower stage component 530 may be an IPD or may include an acoustic wave filter. The lower stage component 530 may be provided with a via conductor.

The upper stage component 540 is an example of the first component disposed on the upper surface 532 of the lower stage component 530. The upper stage component 540 includes a lower surface 541 and connection terminals 543 and 544. The lower surface 541 is an example of the third surface facing the upper surface 532 of the lower stage component 530. Each of the connection terminals 543 and 544 is an example of the first connection terminal or a third connection terminal provided on the lower surface 541.

The upper stage component 545 is an example of a fifth component disposed on the upper surface 532 of the lower stage component 530. The upper stage component 545 includes a lower surface 546 and connection terminals 548 and 549. The lower surface 546 is an example of a sixth surface facing the upper surface 532 of the lower stage component 530. Each of the connection terminals 548 and 549 is an example of a fourth connection terminal provided on the lower surface 546.

In the present embodiment, each of the upper stage components 540 and 545 includes an acoustic wave filter. For example, each of the upper stage components 540 and 545 includes only one SAW filter, but is not limited thereto. At least one of the upper stage components 540 and 545 may include a plurality of SAW filters.

Figure 13:
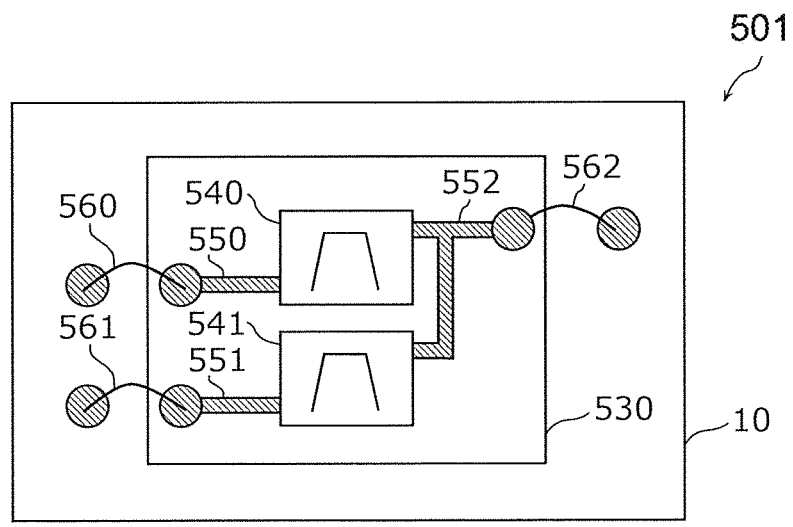
FIG. 13 is a plan view illustrating the configuration of the high-frequency module according to the third embodiment.

In the present embodiment, as illustrated in FIG. 12, wirings 550 to 552 are provided on the upper surface 532 of the lower stage component 530 of the laminated component 520. As illustrated in FIG. 13, the high-frequency module 501 further includes wires 560 to 562.

FIG. 13 is a plan view illustrating a configuration of the high-frequency module 501 according to the present embodiment. Positional relationships between the upper stage components 540 and 545 and the wires 560 and 561 do not coincide with those in FIG. 12. In FIG. 12, an example in which the wires 560 and 561 are provided at both ends of the lower stage component 530 is illustrated, in order to be easily understood.

The wiring 550 is an example of the first wiring which is connected to the connection terminal 543 of the upper stage component 540. The wiring 550 is wire-bonded to the mounting surface 11 of the substrate 10 via the wire 560.

The wiring 551 is an example of the first wiring which is connected to the connection terminal 548 of the upper stage component 545. The wiring 551 is wire-bonded to the mounting surface 11 of the substrate 10 via the wire 561.

The wiring 552 is an example of the first wiring that connects the connection terminal 544 of the upper stage component 540 and the connection terminal 549 of the upper stage component 545. As illustrated in FIG. 13, the wiring 552 is wire bonded to the mounting surface 11 of the substrate 10 via the wire 562.

Each of wires 560 to 562 is a bonding wire formed using a metal material such as gold, copper or aluminum, for example.

In this embodiment, as illustrated in FIG. 13, the upper stage component 540 and the upper stage component 545 are electrically connected to each other by the wire 552 provided on the upper surface 532 of the lower stage component 530. Thus, for example, since the upper stage component 540 and the upper stage component 545 do not have to be connected to each other by wire bonding, it is possible to reduce a height of the high-frequency module 501.

3-2. Effects and the Like

As described above, in the high-frequency module 501 according to the present embodiment, the laminated component 520 includes the upper stage components 540 and 545 disposed on the lower stage component 530. Each of the upper stage components 540 and 545 includes an acoustic wave filter.

Accordingly, since a plurality of upper stage components 540 and 545 is disposed on the lower stage component 530, it is possible to reduce the number of components to be mounted on the mounting surface 11 of the substrate 10. Accordingly, the area of the mounting surface 11 can be reduced, so that the high-frequency module 501 can be made compact.

Further, for example, the upper stage component 545 includes the lower surface 546 facing the upper surface 532 and the connection terminal 549 provided on the lower surface 546. The wiring 552 connects the connection terminal 544 and the connection terminal 549.

Thus, the upper surface 532 of the lower stage component 530 can be used to electrically connect the plurality of upper stage components 540 and 545. For example, since the upper stage component 540 and the upper stage component 545 do not have to be connected to each other by wire bonding, it is possible to achieve the reduction in the height of the high-frequency module 501.

Other Modifications

In each of the above embodiments, the IDT electrode or the like is provided on the lower surface of each of the upper stage component and the lower stage component, but the present disclosure is not limited thereto. For example, at least one of the upper stage component and the lower stage component may be a wafer level package (WLP).

Figure 14:
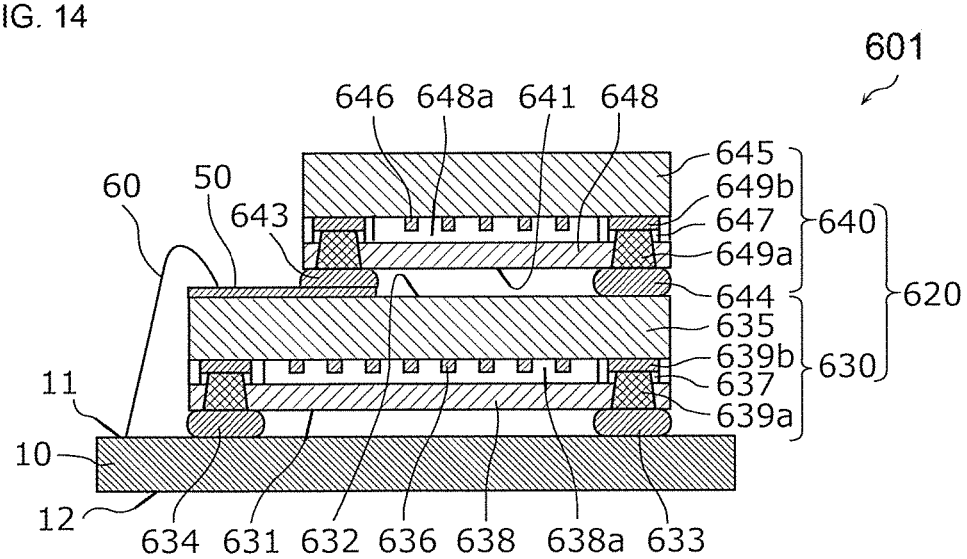
FIG. 14 is a cross-sectional view illustrating the configuration of the high-frequency module according to the modification of each of the embodiments.

FIG. 14 is a cross-sectional view illustrating a configuration of a high-frequency module 601 according to the present modification. As illustrated in FIG. 14, the high-frequency module 601 includes the substrate 10, a laminated component 620, the wiring 50 and the wire 60. The substrate 10, the wiring 50, and the wire 60 are the same as those in the first embodiment and the like. The high-frequency module 601 may also include at least one of the component 70, the component 80, the cap member 90, and the encapsulating member 91.

The laminated component 620 includes a lower stage component 630 and an upper stage component 640. In this modification, each of the lower stage component 630 and the upper stage component 640 is a WLP including a SAW filter. Each of the lower stage portion 630 and the upper stage portion 640 has a piezoelectric substrate having both a propagation function of acoustic waves and a package function.

Specifically, the lower stage component 630 includes a piezoelectric substrate 635, an IDT electrode 636, a support layer 637, a cover member 638, columnar electrodes 639a, and electrode pads 639b. The lower stage component 630 is an example of the first component, and includes a lower surface 631, an upper surface 632, and connection terminals 633 and 634 as in the first embodiment and the like.

The piezoelectric substrate 635 is a substrate having piezoelectricity on at least a surface of a lower surface 631 side. The IDT electrode 636 is provided on the surface of the lower surface 631 side of the piezoelectric substrate 635, and is electrically connected to the electrode pads 639b. The IDT electrode 636 is a comb-shaped electrode including, for example, a single layer film or a multi-layer film of Cu, Al or Pt, or an alloy thereof.

The support layer 637 is a support member which is formed so as to surround the IDT electrode 636. The support layer 637 supports the cover member 638. Further, the support layer 637 covers the electrode pad 639b. A through-hole exposing a part of the electrode pad 639b is provided in the support layer 637, and the columnar electrode 639a is provided so as to fill the through-hole. The support layer 637 is formed using, for example, a material containing at least one of polyimide, epoxy, benzocyclobutene (BCB), polybenzoxazole (PBO), metal and silicon oxide.

The cover member 638 is provided so as to face the lower surface (that is, the surface on which the IDT electrode 636 is provided) of the piezoelectric substrate 635. The cover member 638 is supported by the support layer 637 to form a space 638a between the piezoelectric substrate 635 and the cover member 638 itself. That is, the cover member 638 and the piezoelectric substrate 635 are disposed apart from each other, and the IDT electrode 636 is provided in the space 638a. The cover member 638 is formed using, for example, a material containing at least one of epoxy, urethane, phenol, polyester, BCB and PBO.

The columnar electrode 639a electrically connects the electrode pad 639b and the connection terminal 633. The columnar electrode 639a is formed using, for example, a Cu/Ni alloy, a Ni/Au alloy, or the like. The electrode pad 639b is electrically connected to the IDT electrode 636. The electrode pad 639b is formed using, for example, the same material as the IDT electrode 636. The electrode pad 639b may have a thin film laminated structure formed using a different conductive material.

The upper stage component 640 includes a piezoelectric substrate 645, an IDT electrode 646, a support layer 647, a cover member 648, columnar electrodes 649a, and electrode pads 649b. Note that the upper stage component 640 is an example of the second component, and includes a lower surface 641 and connection terminals 643 and 644, similarly to the first embodiment and the like. The upper stage component 640 has the same configuration as that of the lower stage component 630. Specifically, the piezoelectric substrate 645, the IDT electrode 646, the support layer 647, the cover member 648, the columnar electrode 649a, and the electrode pad 649b correspond to the piezoelectric substrate 635, the IDT electrode 636, the support layer 637, the cover member 638, the columnar electrode 639a, and the electrode pad 639b, respectively.

As described above, in this modification, the IDT electrode 636 is not provided on the lower surface 631 of the lower stage component 630. The lower surface 631 corresponds to a main surface of the cover member 638. The IDT electrode 636 is not provided on the upper surface 632 of the lower stage component 630, but is located in an inner portion of the lower stage component 630. Similarly, in the upper stage component 640, the IDT electrode 646 is disposed in the space 648a formed between the piezoelectric substrate 645 and the cover member 648, and is not provided on the lower surface 641 of the upper stage component 640.

According to the present modification, since each of the IDT electrodes 636 and 646 is covered with the cover members 638 and 648, direct contact with an outer portion can be avoided, and protection performance can be enhanced. Note that, as illustrated in the embodiments, when the IDT electrode is exposed on the lower surface, the cover member 638 and the columnar electrode 639a do not have to be provided, so that the configuration can be simplified.

Other Embodiments

Although the high-frequency module according to one or more embodiments has been described based on the embodiments, the present disclosure is not limited to these embodiments. A form in which various modifications that would occur to those skilled in the art are applied to the embodiments, as well as a form that is constructed by combining the constituent elements in the different embodiments are also included within the scope of the present disclosure, without departing from the spirit of the present disclosure.

For example, the connection terminal of the upper stage component may be electrically connected to the substrate via a side electrode provided along a side surface of the lower stage component instead of the via conductor. Similarly, the wiring to which the connection terminal of the upper stage component is connected may be electrically connected to the substrate via the side electrode provided along the side surface of the lower stage component instead of the wire.

Moreover, for example, circuit components may be mounted on only one side of the substrate. For example, the high-frequency module 1 according to the first embodiment does not have to include the component 80.

Further, for example, the laminated component may have a laminated structure having three or more stages. In this case, wiring is provided on at least one of upper surfaces of the components other than an uppermost stage component.

Alternatively, wiring may be provided on the upper surfaces of all of the components other than the uppermost stage component.

For example, the acoustic wave filter included in each component may be a low pass filter or a high pass filter.

Further, for example, in the high-frequency modules according to the embodiments and the modifications thereof, other circuit elements and wirings may be inserted on the paths connecting the circuit elements and the signal paths disclosed in the figures.

In addition, in the embodiments described above, various modifications, substitutions, additions and omissions may be made in the claims and the equivalents thereof.

The present disclosure can be used as a compact high-frequency module, and can be widely used in communication devices such as a cellular phone, as a high-frequency module to be disposed in a multi-band compatible front-end unit.

While preferred embodiments of the disclosure have been described above, it is to be understood that variations and modifications will be apparent to those skilled in the art without departing from the scope and spirit of the disclosure. The scope of the disclosure, therefore, is to be determined solely by the following claims.

What is claimed is:

1. A high-frequency-module comprising:
a substrate having a first mounting surface;
a first laminated component disposed on the first mounting surface;
a first wiring;
a third integrated circuit;
an acoustic wave filter;
a first switch circuit disposed between an antenna element and the acoustic wave filter;
a second switch circuit;
an amplifier circuit disposed between the second switch circuit and the acoustic wave filter; and
a matching circuit disposed between the acoustic wave filter and the amplifier circuit,
wherein the first laminated component comprises:
a first component, and
a second component disposed on the first component,
wherein the first component comprises:
a first surface facing the first mounting surface,
a second surface facing the first surface back to back, and
a first connection terminal provided on the first surface,
wherein the second component comprises:
a third surface facing the second surface, and
a second connection terminal provided on the third surface,
wherein the first wiring is provided on the second surface and is connected to the second connection terminal,
wherein at least a part of the first wiring is not covered by the second component,
wherein the substrate comprises a second mounting surface facing the first mounting surface back to back,
wherein the third integrated circuit is provided on the second mounting surface,
wherein the acoustic wave filter, the first switch circuit, and the matching circuit are disposed on a side of the first mounting surface,
wherein the acoustic wave filter is included in the first component or the second component, and
wherein the amplifier circuit and the second switch circuit are included in the third integrated circuit.

2. The high-frequency module according to claim 1, wherein the first wiring is connected by wire bonding to the first mounting surface or a component different from the first component and the second component provided on the first mounting surface.

3. The high-frequency module according to claim 2, wherein the acoustic wave filter is a first acoustic wave filter or a second acoustic wave filter,
wherein the first component comprises the first acoustic wave filter having a first terminal,
wherein the second component comprises the second acoustic wave filter having a second terminal, and
wherein the first terminal is an input terminal or an output terminal of the first acoustic wave filter, and the second terminal is an input terminal or an output terminal of the second acoustic wave filter, and the first terminal and the second terminal are electrically connected to each other in the first laminated component.

4. The high-frequency module according to claim 2, wherein the acoustic wave filter is a first acoustic wave filter or a second acoustic wave filter,
wherein the first component comprises the first acoustic wave filter or is a first integrated circuit or a first integrated passive device, and
wherein the second component comprises the second acoustic wave filter or is a second integrated circuit or a second integrated passive device.

5. The high-frequency module according to claim 2, wherein the first component further comprises a via conductor extending through the first component,
wherein the second component further comprises a third connection terminal, and
wherein the via conductor electrically connects the first connection terminal and the third connection terminal.

6. The high-frequency module according to claim 2, further comprising:
a second laminated component disposed on the first mounting surface, wherein the second laminated component comprises:
  a third component, and
  a fourth component disposed on the third component,
wherein the third component comprises:
  a fourth surface facing the first mounting surface,
  a fifth surface facing the fourth surface back to back, and
  a second wiring provided on the fifth surface, and
wherein the second wiring is connected to a wiring provided on the second surface by wire bonding.

7. The high-frequency module according to claim 1,
wherein the acoustic wave filter is a first acoustic wave filter or a second acoustic wave filter,
wherein the first component comprises the first acoustic wave filter having a first terminal,
wherein the second component comprises the second acoustic wave filter having a second terminal, and
wherein the first terminal is an input terminal or an output terminal of the first acoustic wave filter, and the second terminal is an input terminal or an output terminal of the second acoustic wave filter, and the first terminal and the second terminal are electrically connected to each other in the first laminated component.

8. The high-frequency module according to claim 7,
wherein at least a part of the first wiring is an inductor, and
wherein the inductor is a matching circuit connected to an input terminal or an output terminal of any one of the first acoustic wave filter and the second acoustic wave filter.

9. The high-frequency module according to claim 8,
wherein the first component further comprises a via conductor extending through the first component,
wherein the second component further comprises a third connection terminal, and
wherein the via conductor electrically connects the first connection terminal and the third connection terminal.

10. The high-frequency module according to claim 7,
wherein the first component further comprises a via conductor extending through the first component,
wherein the second component further comprises a third connection terminal, and
wherein the via conductor electrically connects the first connection terminal and the third connection terminal.

11. The high-frequency module according to claim 7, further comprising:
a second laminated component disposed on the first mounting surface,
wherein the second laminated component comprises:
  a third component, and
  a fourth component disposed on the third component,
wherein the third component comprises:
  a fourth surface facing the first mounting surface,
  a fifth surface facing the fourth surface back to back, and
  a second wiring provided on the fifth surface, and
wherein the second wiring is connected to a wiring provided on the second surface by wire bonding.

12. The high-frequency module according to claim 1,
wherein the acoustic wave filter is a first acoustic wave filter or a second acoustic wave filter,
wherein the first component comprises the first acoustic wave filter or is a first integrated circuit or a first integrated passive device, and
wherein the second component comprises the second acoustic wave filter or is a second integrated circuit or a second integrated passive device.

13. The high-frequency module according to claim 12,
wherein the first component further comprises a via conductor extending through the first component,
wherein the second component further comprises a third connection terminal, and
wherein the via conductor electrically connects the first connection terminal and the third connection terminal.

14. The high-frequency module according to claim 1,
wherein the first component further comprises a via conductor extending through the first component,
wherein the second component further comprises a third connection terminal, and
wherein the via conductor electrically connects the first connection terminal and the third connection terminal.

15. The high-frequency module according to claim 1, further comprising:
a second laminated component disposed on the first mounting surface,
wherein the second laminated component comprises:
  a third component, and
  a fourth component disposed on the third component,
wherein the third component comprises:
  a fourth surface facing the first mounting surface,
  a fifth surface facing the fourth surface back to back, and
  a second wiring provided on the fifth surface, and
wherein the second wiring is connected to a wiring provided on the second surface by wire bonding.

16. The high-frequency module according to claim 1, wherein the matching circuit is disposed on a side of the second mounting surface.

17. The high-frequency module according to claim 1,
wherein the first laminated component further comprises a fifth component disposed on the first component, and
wherein each of the second component and the fifth component comprises an acoustic wave filter.

18. The high-frequency module according to claim 17,
wherein the fifth component comprises:
  a sixth surface facing the second surface, and
  a fourth connection terminal provided on the sixth surface, and
wherein the first wiring connects the second connection terminal and the fourth connection terminal.

* * * * *